US011152262B2

(12) United States Patent
Lee et al.

(10) Patent No.: US 11,152,262 B2
(45) Date of Patent: Oct. 19, 2021

(54) CUT METAL GATE DEVICES AND PROCESSES

(71) Applicant: Taiwan Semiconductor Manufacturing Co., Ltd., Hsinchu (TW)

(72) Inventors: Chun-Yi Lee, Hsinchu (TW); Ting-Gang Chen, Taipei (TW); Chieh-Ping Wang, Hsinchu (TW); Hong-Hsien Ke, Changhua County (TW); Chia-Hui Lin, Dajia Township (TW); Tai-Chun Huang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/680,755

(22) Filed: Nov. 12, 2019

(65) Prior Publication Data

US 2020/0176259 A1  Jun. 4, 2020

Related U.S. Application Data

(60) Provisional application No. 62/774,017, filed on Nov. 30, 2018.

(51) Int. Cl.
*H01L 21/8234* (2006.01)
*H01L 21/28* (2006.01)
*H01L 21/3213* (2006.01)
*H01L 21/02* (2006.01)

(52) U.S. Cl.
CPC .. *H01L 21/823431* (2013.01); *H01L 21/0217* (2013.01); *H01L 21/0228* (2013.01); *H01L 21/02211* (2013.01); *H01L 21/02274* (2013.01); *H01L 21/28123* (2013.01); *H01L 21/32135* (2013.01); *H01L 21/32139* (2013.01); *H01L 21/823437* (2013.01); *H01L 21/823481* (2013.01)

(58) Field of Classification Search
None
See application file for complete search history.

(56) References Cited

U.S. PATENT DOCUMENTS

| | | | | |
|---|---|---|---|---|
| 2002/0137323 A1* | 9/2002 | Loboda | ............. | H01L 23/53223 438/600 |
| 2006/0110900 A1* | 5/2006 | Youn | ................. | H01L 21/28247 438/592 |
| 2009/0104741 A1* | 4/2009 | Shin | .................... | H01L 21/8234 438/229 |

* cited by examiner

*Primary Examiner* — Anthony Ho
*Assistant Examiner* — Kevin Quinto
(74) *Attorney, Agent, or Firm* — Slater Matsil, LLP

(57) ABSTRACT

A method includes etching a gate structure to form a trench extending into the gate structure, wherein sidewalls of the trench comprise a metal oxide material, applying a sidewall treatment process to the sidewalls of the trench, wherein the metal oxide material has been removed as a result of applying the sidewall treatment process and filling the trench with a first dielectric material to form a dielectric region, wherein the dielectric region is in contact with the sidewall of the gate structure.

20 Claims, 39 Drawing Sheets

US 11,152,262 B2

1

CUT METAL GATE DEVICES AND PROCESSES

PRIORITY

This application claims the benefit of U.S. Provisional Application No. 62/774,017, filed on Nov. 30, 2018, entitled "Cut Metal Gate Devices and Processes," which application is hereby incorporated by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
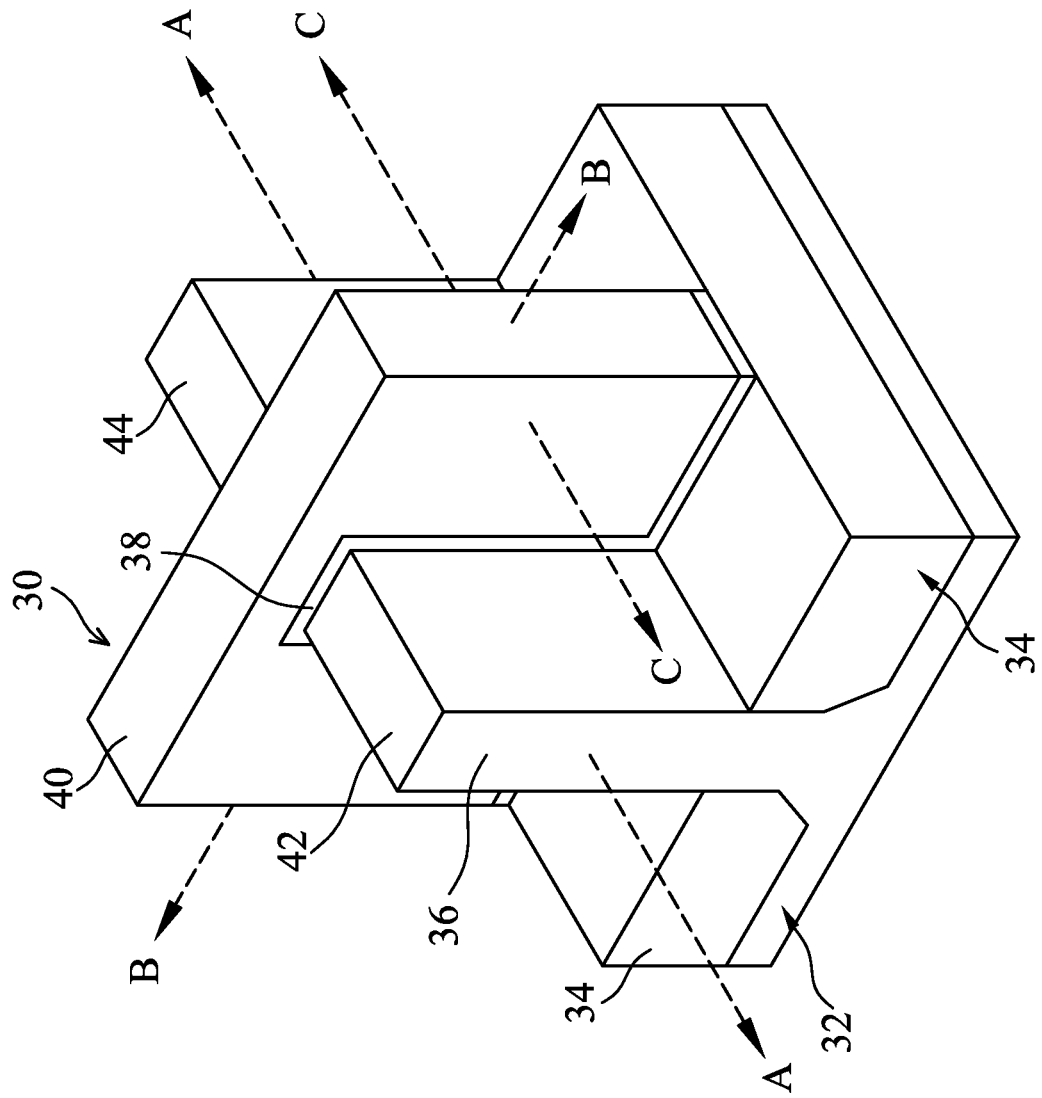
FIG. 1 is a perspective view of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of healing sidewall damages of the trench of a metal gate of a Fin Field-Effect Transistor (FinFET) device.

FIG. 1 illustrates an example of a FinFET 30 in a perspective view. The FinFET 30 includes a substrate 32 having a fin 36. The substrate 32 has isolation regions 34 formed thereon, and the fin 36 protrudes above and between neighboring isolation regions 34. A gate dielectric 38 is along sidewalls and over a top surface of the fin 36, and a gate electrode 40 (also referred to as a gate) is over the gate dielectric 38. Source/drain regions 42 and 44 are in the fin on opposite sides of the gate dielectric 38 and gate electrode 40.

FIG. 1 further illustrates reference cross-sections that are used in later figures. Cross-section B-B extends along a longitudinal axis of the gate electrode 40 of the FinFET 30. Cross-section A-A is perpendicular to cross-section B-B and is along a longitudinal axis of the fin 36 and in a direction of, for example, a current flow between the source/drain regions 42 and 44. Cross-section C-C is parallel to cross-section A-A and is outside fin 36. Subsequent figures refer to these reference cross-sections for clarity.

FIGS. 2-39 illustrate various views of a FinFET device 100 at various stages of fabrication in accordance with some embodiments. The FinFET device 100 is similar to the FinFET 30 in FIG. 1, except for multiple fins and multiple gate structures. For reference, each of FIGS. 2-39 showing a cross-sectional view is labeled with its respective cross-section.

Figure 2:
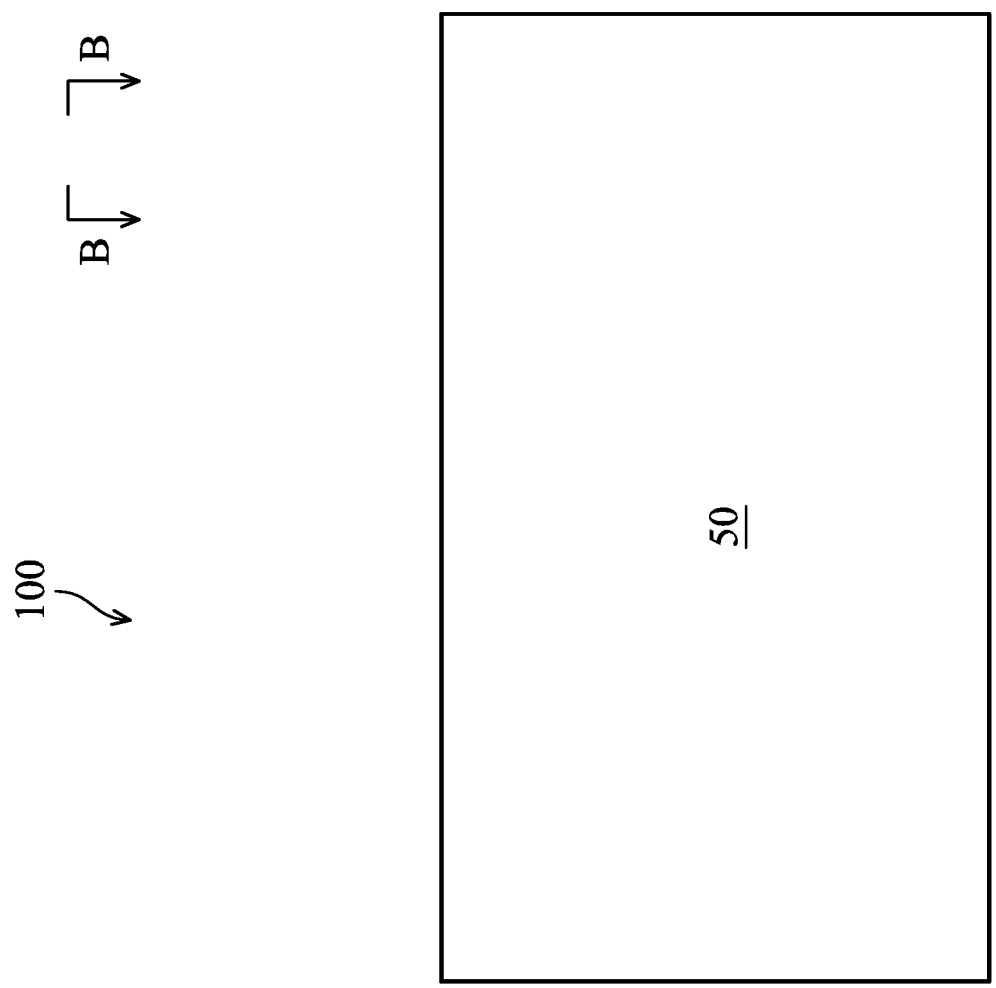
FIGS. 2-39 illustrate various views of the formation of a metal gate cut in a FinFET device at various stages of fabrication, in accordance with an embodiment.

FIG. 2 illustrates a cross-sectional view of a substrate 50 along cross-section B-B. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon, germanium, a compound semiconductor such as silicon carbide, gallium arsenic, gallium phosphide, indium phosphide, indium arsenide, indium antimonide, or the like, an alloy semiconductor such as SiGe, GaAsP, AlInAs, AlGaAs, GaInAs, GaInP, GaInAsP, or the like, another kind of semiconductor material, or combinations thereof.

Figure 3:
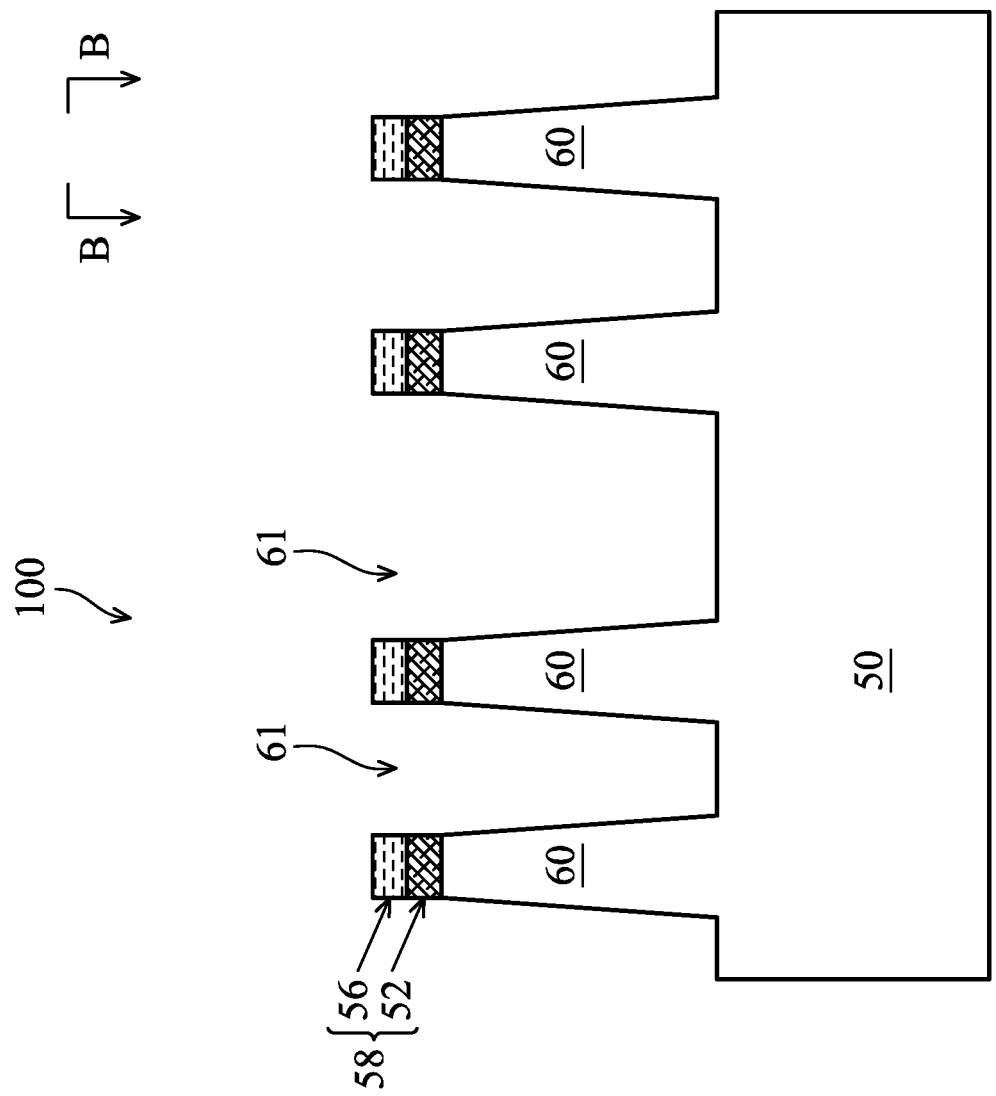

Referring to FIG. 3, the substrate 50 shown in FIG. 2 is patterned using, for example, photolithography and etching techniques. For example, a mask layer, such as a pad oxide layer 52 and an overlying pad nitride layer 56, may be formed over the substrate 50. The pad oxide layer 52 may be a thin film including silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof. The pad nitride layer 56 may be formed using low-pressure chemical vapor deposition (LPCVD) process, a plasma enhanced chemical vapor deposition (PECVD) process, or using another process.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58. As illustrated in FIG. 3, the patterned mask 58 includes patterned pad oxide 52 and patterned pad nitride 56.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches 61 in the substrate 50 using, for example, reactive ion etch (RIE), neutral beam etch (NBE), the like, or a combination thereof. The etch may be anisotropic. In some embodiments, the trenches 61 may be strips (in a plan view) parallel to each other, and closely spaced with respect to each other. In some embodiments, the trenches 61 may be continuous and surround the semiconductor strips 60. After semiconductor strips 60 are formed, the patterned mask 58 may be removed by etching or any suitable method. In some embodiments, the tops of adjacent semiconductor strips 60 may be separated by a width that is between about 30 nm and about 50 nm.

Figure 4:
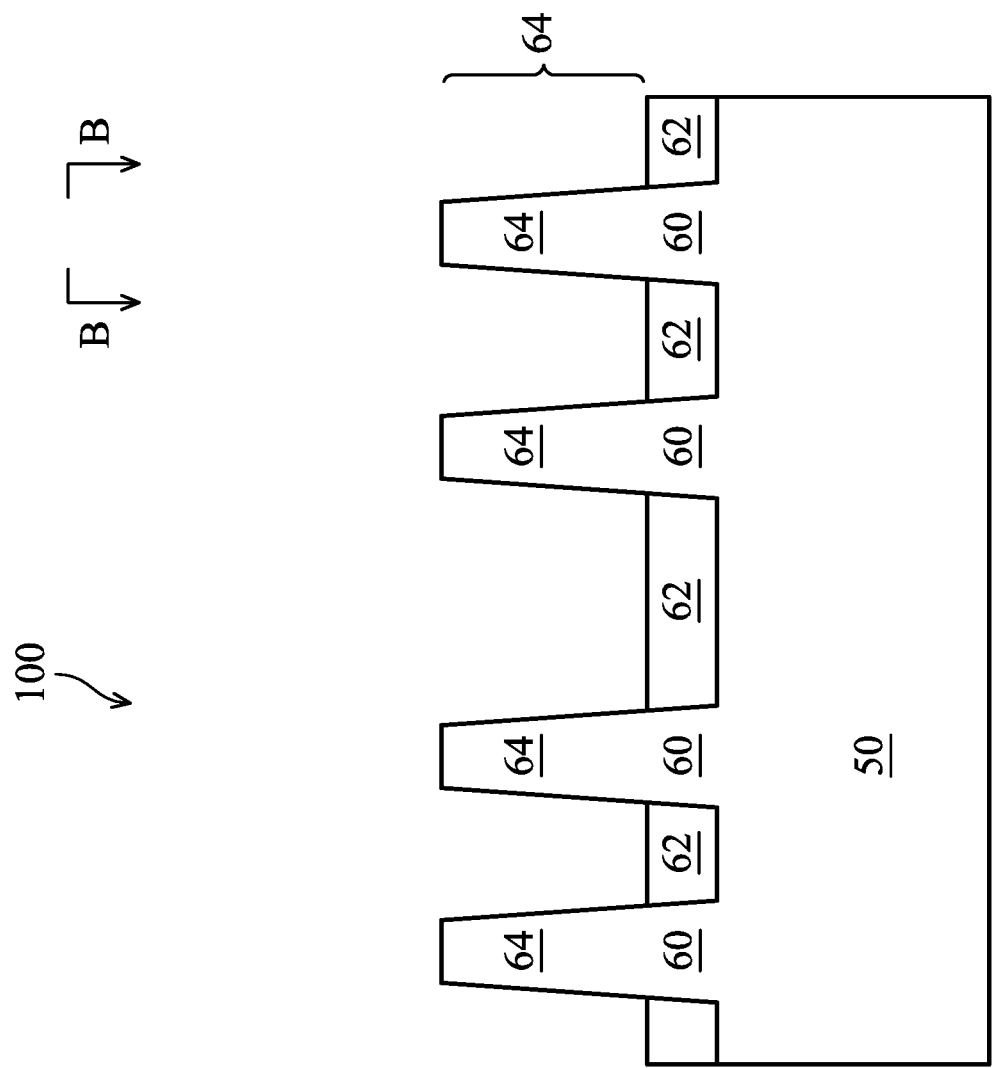
Figure 5:
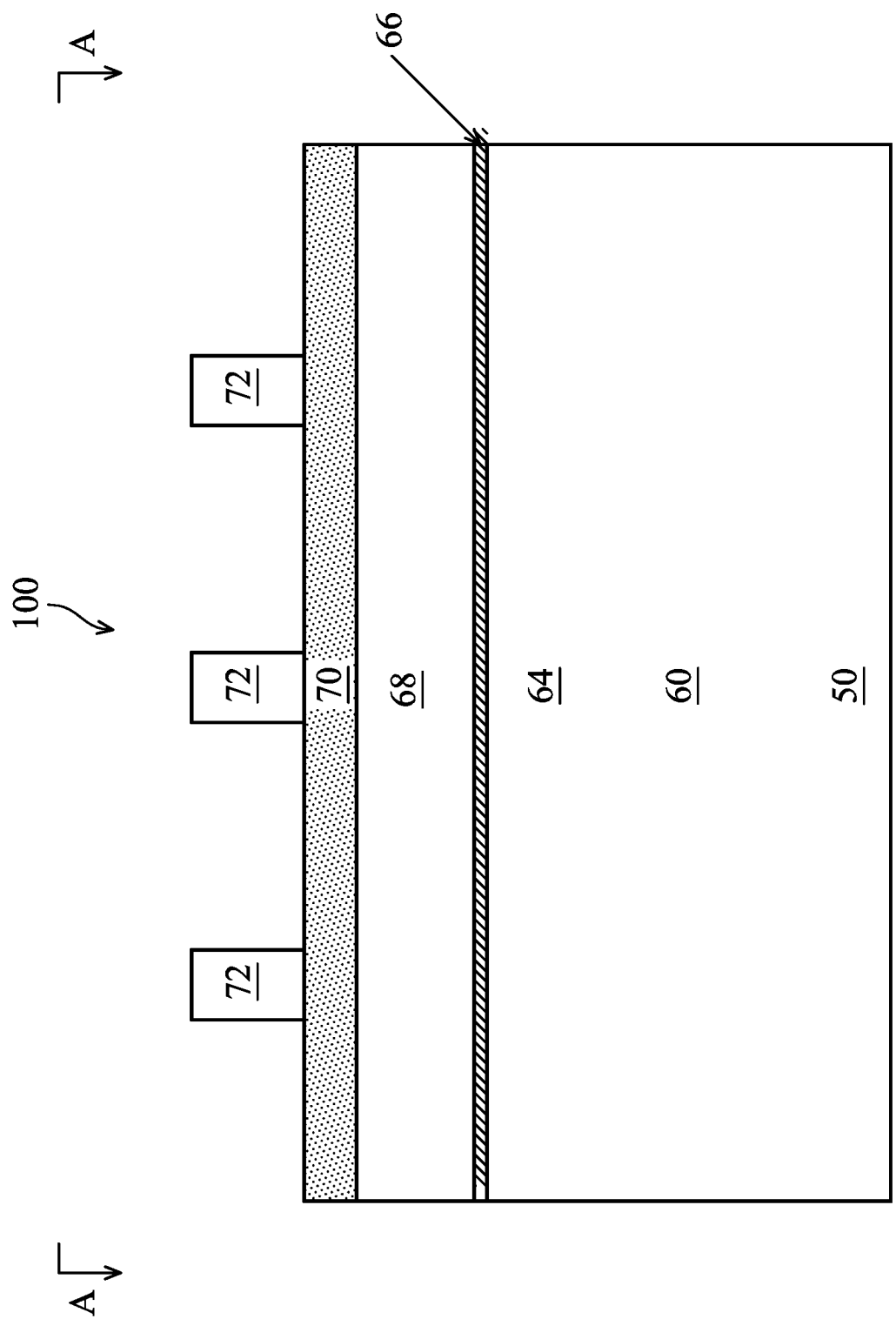
Figure 6:
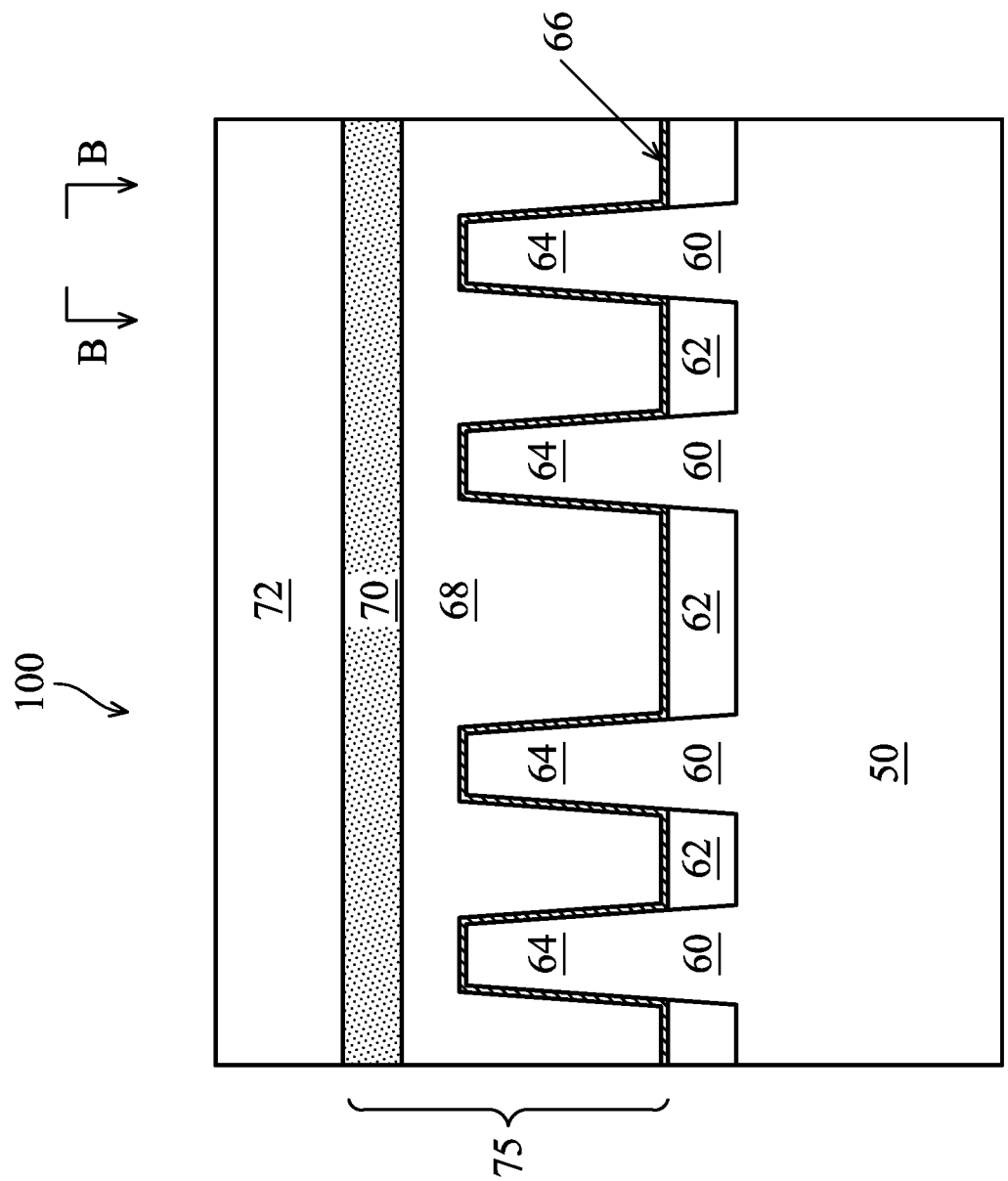
Figure 7:
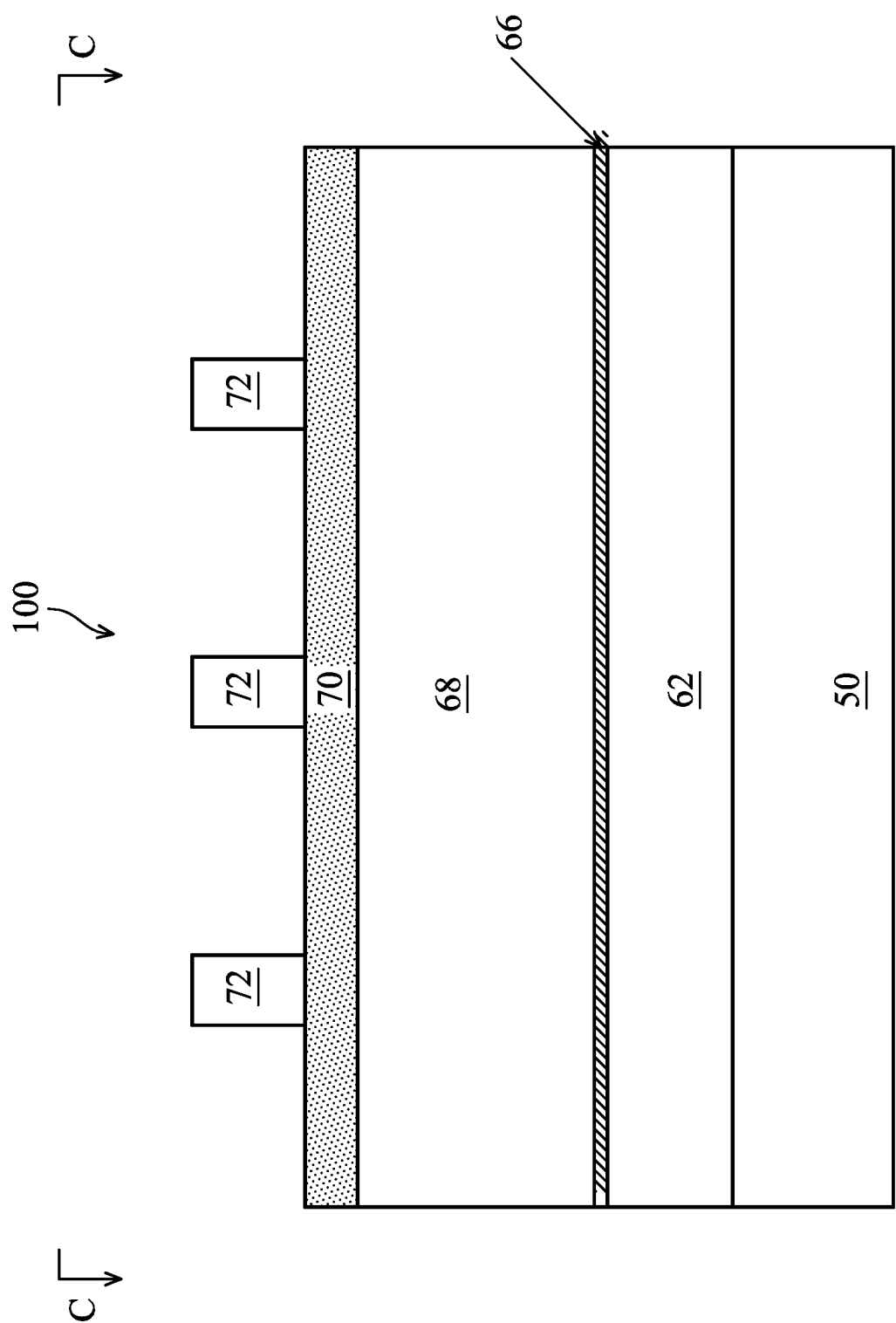

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. An anneal process may be performed once the insulation material is formed. A planarization process, such as a chemical mechanical polish (CMP) process, may remove any excess insulation material (and, if present, the patterned mask 58) and form top surfaces of the isolation regions 62 and top surfaces of the semiconductor strips 60 that are coplanar (not shown).

In some embodiments, the isolation regions 62 include a liner, e.g., a liner oxide (not shown), at the interface between the isolation region 62 and the substrate 50/semiconductor strip 60. In some embodiments, the liner oxide is formed to reduce crystalline defects at the interface between the substrate 50 and the isolation region 62. Similarly, the liner oxide may also be used to reduce crystalline defects at the interface between the semiconductor strip 60 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed such that the upper portions of the semiconductor strips 60 protrude from between neighboring isolation regions 62 and form semiconductor fins 64 (also referred to as fins 64). The recessed isolation regions 62 may be shallow trench isolation (STI) regions in some embodiments. The top surfaces of the isolation regions 62 may have a flat surface (as illustrated), a convex surface, a concave surface, or a combination thereof. The top surfaces of the isolation regions 62 may be formed flat, convex, and/or concave by an appropriate etch. In some cases, the isolation regions 62 may be recessed using a dry etch, and the dry etch may use an etching gas such as ammonia, hydrogen fluoride, another etching gas, or a combination of etching gases. Other suitable etching processes may also be used to recess the isolation regions 62.

FIGS. 2 through 4 illustrate an embodiment of forming fins 64, but fins may be formed in various different processes. In one example, a dielectric layer can be formed over a top surface of a substrate and trenches can be etched through the dielectric layer. Homoepitaxial structures can be epitaxially grown in the trenches or heteroepitaxial structures can be epitaxially grown in the trenches using a material different from the substrate. The dielectric layer can then be recessed such that the homoepitaxial structures or heteroepitaxial structures protrude from the dielectric layer to form the fins. In other embodiments, heteroepitaxial structures can be used for the fins. For example, the semiconductor strips can be recessed, and a material different from the semiconductor strips may be epitaxially grown in their place.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon, silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In some embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may be used to pattern the fins.

FIGS. 5-10 illustrate steps of forming dummy gate structures 75 (shown in FIG. 8) over the semiconductor fins 64. The example dummy gate structures 75 include a dummy gate dielectric 66, a dummy gate fill 68, and a mask 70 (shown in FIG. 8). To form the dummy gate structures 75, a dielectric material is first formed over the semiconductor fins 64 and the isolation regions 62. The dummy gate dielectric 66 will subsequently be formed from the dielectric material. The dielectric material may be, for example, silicon oxide, silicon nitride, multilayers thereof, or the like, and may be deposited or thermally grown according to acceptable techniques. In some embodiments, the dielectric material may be a high-k dielectric material, and in these embodiments, the dielectric material may have a k value greater than about 7.0, and may include a metal oxide or a silicate of Hf, Al, Zr, La, Mg, Ba, Ti, Pb, multilayers thereof, or combinations thereof. The formation methods of dielectric material may include molecular-beam deposition (MBD), atomic layer deposition (ALD), plasma-enhanced CVD (PECVD), and the like.

A dummy gate material is then formed over the dummy gate dielectric material, and a mask layer is formed over the gate material. The dummy gate fill 68 and mask 70 are subsequently formed from the dummy gate material and the mask layer, respectively as shown in FIGS. 5-10. The dummy gate material may be deposited over the dielectric material and then planarized, such as by a CMP process. The mask layer may then be deposited over the planarized dummy gate material. In some embodiments, the dummy gate material may be formed of polysilicon, although other materials may also be used. In some embodiments, the dummy gate material may include a metal-containing material such as TiN, TaN, TaC, Co, Ru, Al, combinations thereof, or multi-layers thereof. In some embodiments, the mask layer may be a hardmask, and may be formed of silicon nitride, although other materials may also be used.

Figure 8:
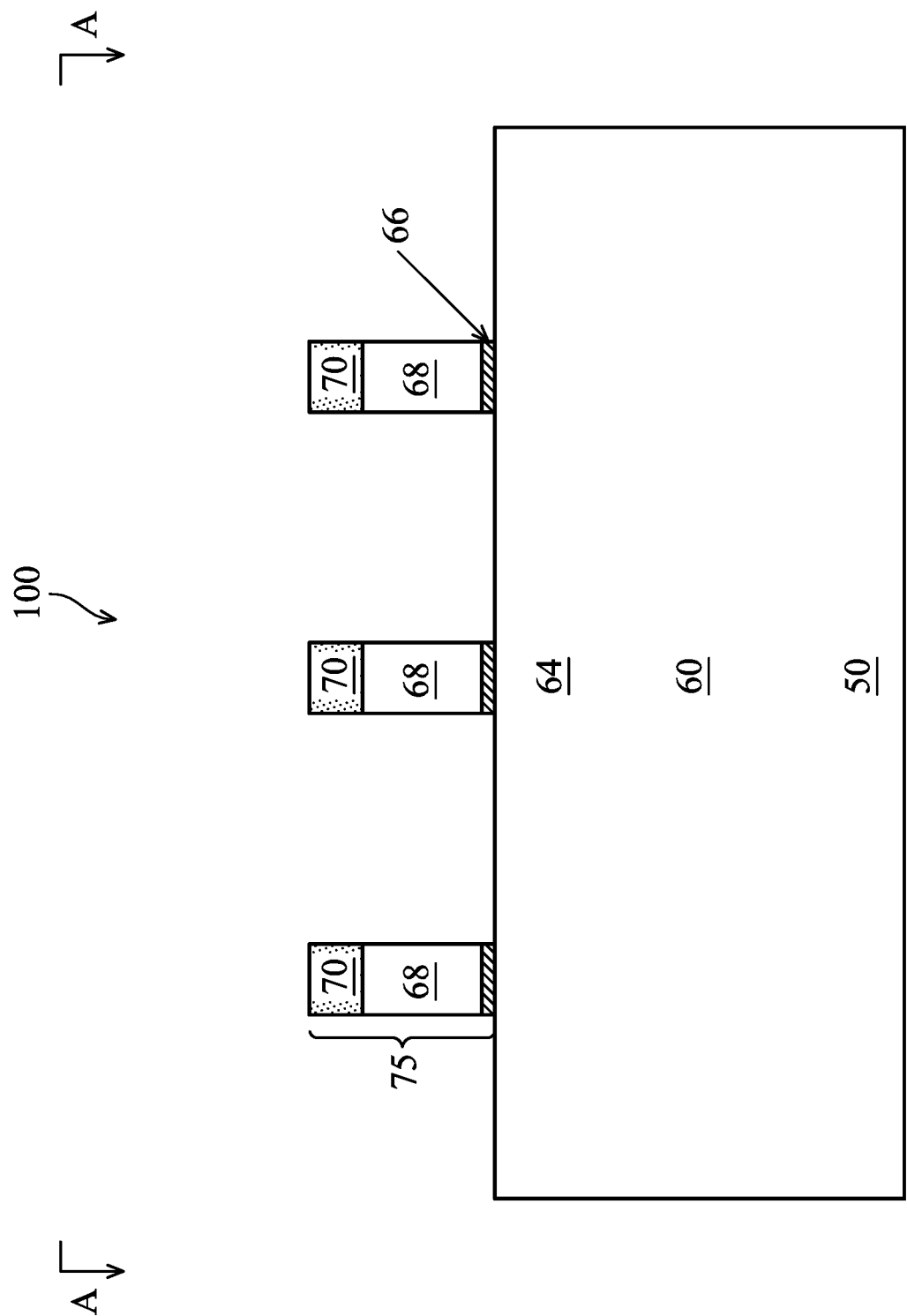
Figure 9:
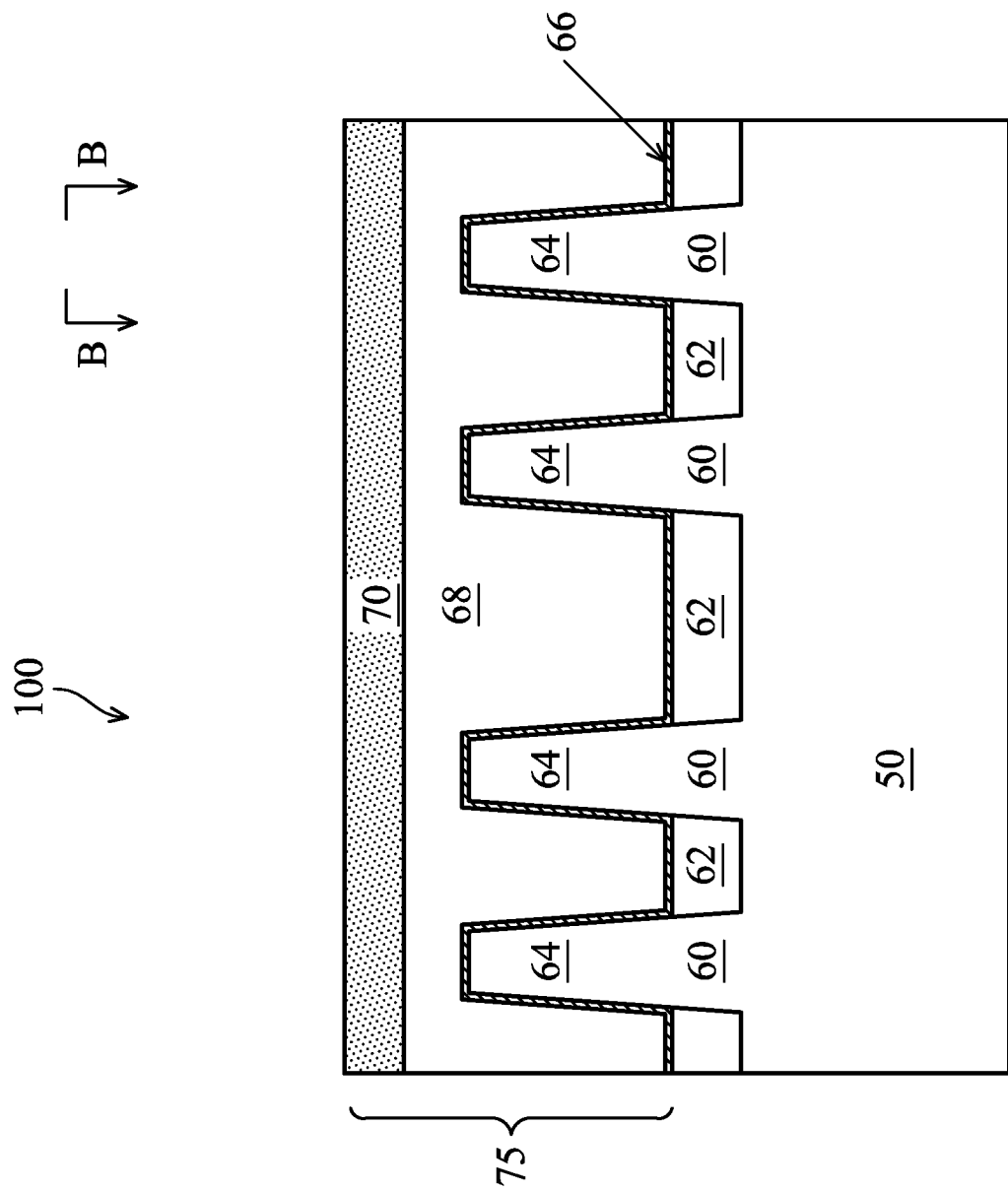
Figure 10:
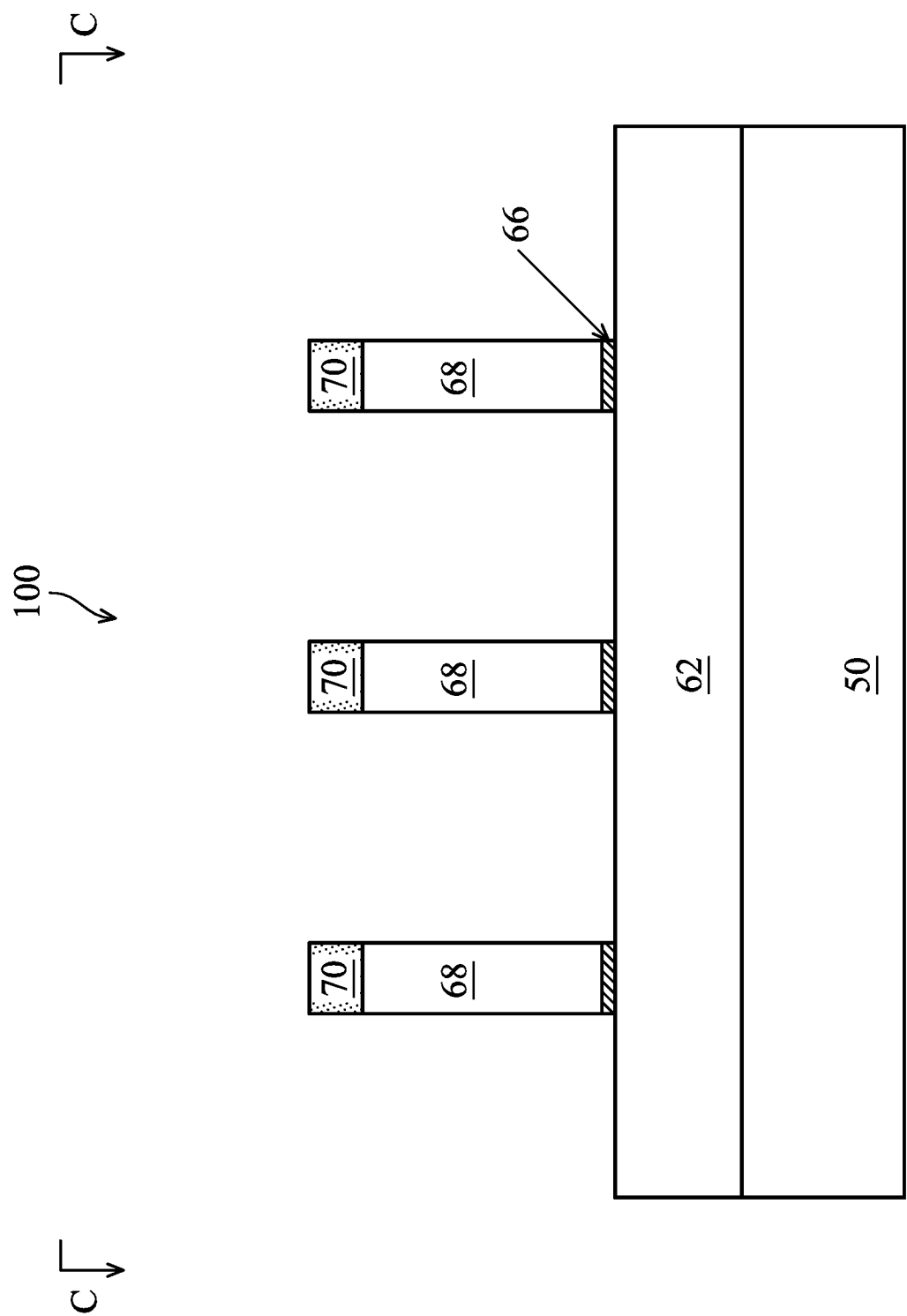

After the dielectric material, the dummy gate material, and the mask layer are formed, the mask layer may be patterned using acceptable photolithography and etching techniques to form mask 70. For example, a photoresist 72 may be formed over the mask layer and patterned using photolithographic techniques, resulting in the example structure shown in FIGS. 5-7. The pattern of photoresist 72 then may be transferred to the mask layer by a suitable etching technique to form mask 70. The pattern of the mask 70 then may be transferred to the dummy gate material and the dielectric layer by a suitable etching technique to form dummy gate fill 68 and dummy gate dielectric 66, respectively. An example resulting structure is shown in FIGS. 8-10. The dummy gate fill 68 and dummy gate dielectric 66 cover respective channel regions of the semiconductor fins 64. The dummy gate fill 68 may also have a lengthwise direction substantially perpendicular to the lengthwise direction of respective semiconductor fins 64. Although three gate structures 75 are illustrated over a semiconductor fin 64 in the cross-sectional view of FIG. 8, more or fewer gate structures 75 may be formed over a semiconductor fin 64.

Figure 11:
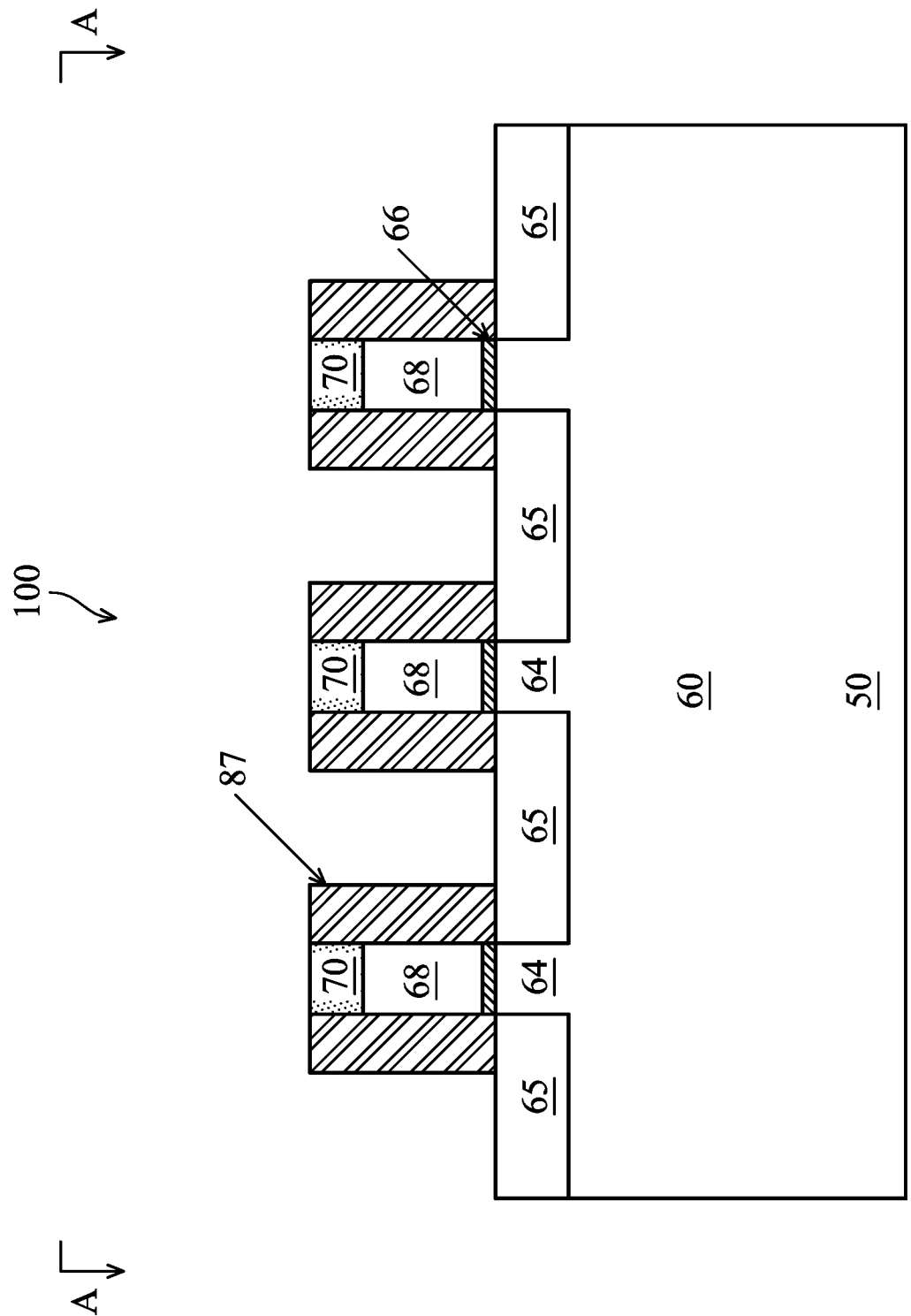
Figure 12:
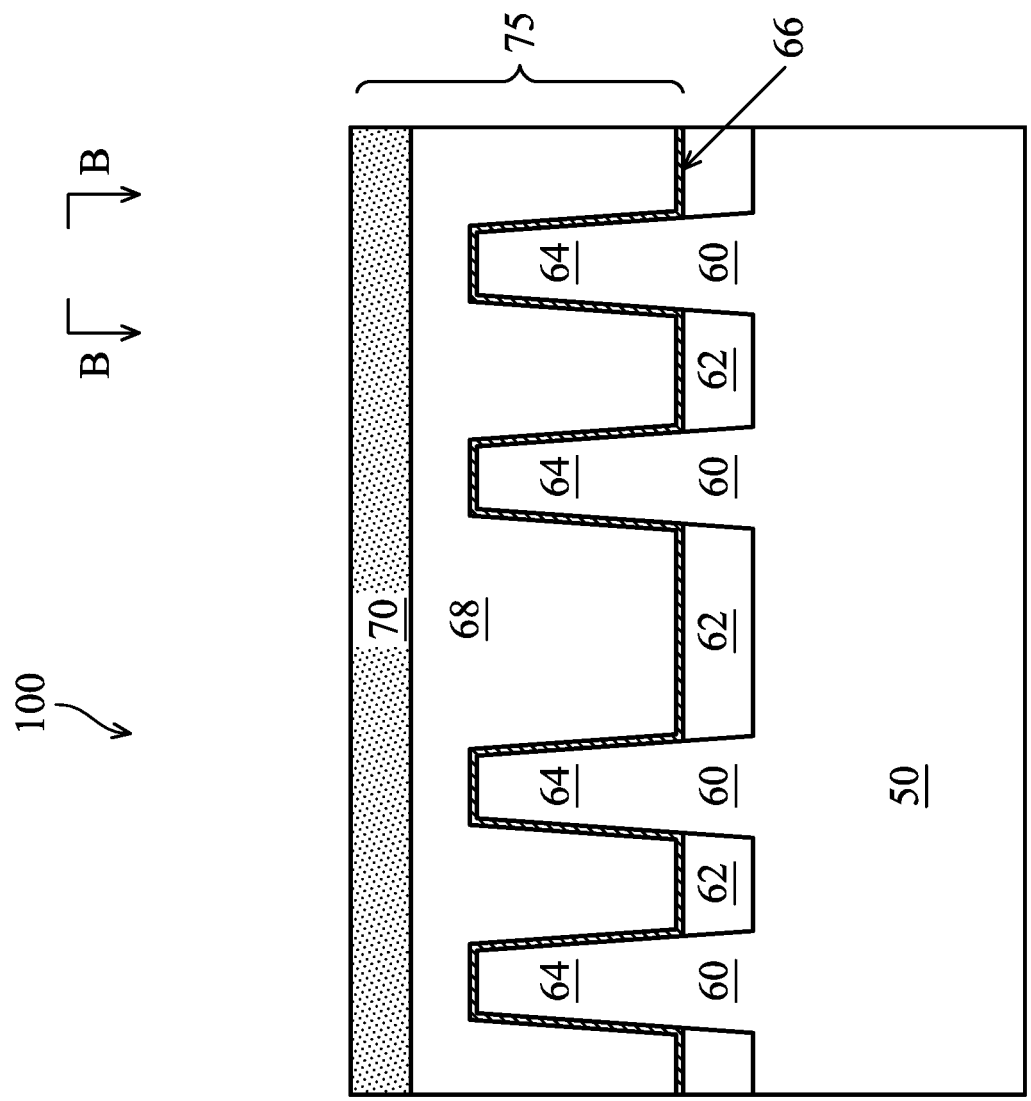
Figure 13:
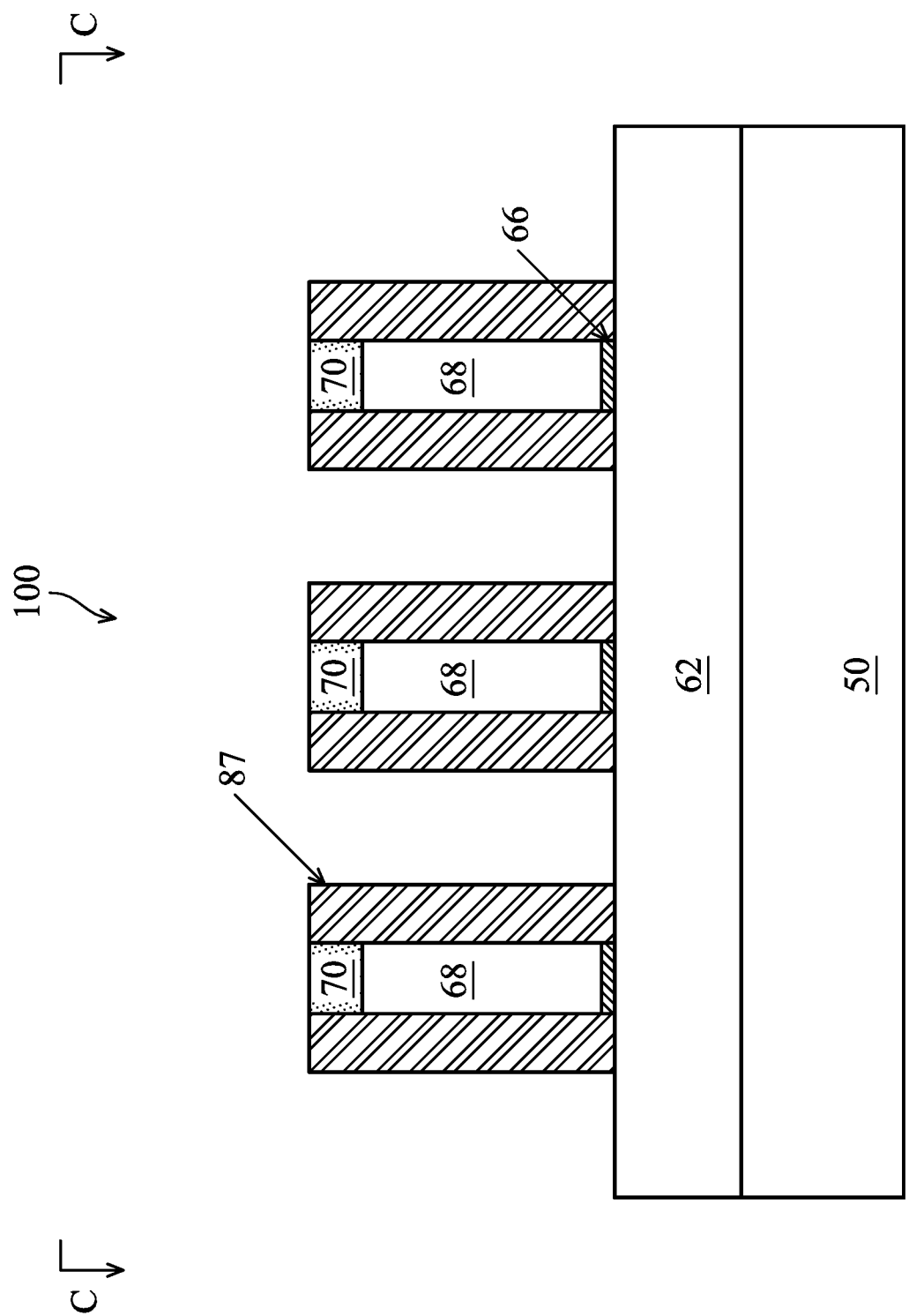

Turning to FIGS. 11-13, lightly doped drain (LDD) regions 65 are formed in the semiconductor fins 64. The LDD regions 65 may be formed by an implantation process. The implantation process may implant N-type or P-type impurities in the semiconductor fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 11 illustrates a non-limiting example of the LDD regions 65. Other configurations, shapes, and formation methods of the LDD regions 65 are also possible and are fully intended to be included within the scope of the present disclosure. For example, LDD regions 65 may be formed after spacers 87 are formed in other embodiments.

After the LDD regions 65 are formed, spacers 87 are formed on the gate structures 75. In the example of FIG. 11, the spacers 87 are formed on opposing sidewalls of the gate 68 and on opposing sidewalls of the gate dielectric 66. The spacers 87 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The spacers 87 may also extend over the upper surface of the semiconductor fins 64 and the upper surface of the isolation region 62.

The shapes and formation methods of the spacers 87 as illustrated in FIG. 11 are merely non-limiting examples, and other shapes and formation methods are possible. For example, the spacers 87 may include first spacers (not shown) and second spacers (not shown). The first spacers may be formed on opposing sidewalls of the gate structures 75. The second spacers may be formed on the first spacers, with the first spacers disposed between a respective gate structure 75 and the respective second spacers. In some cases, the first spacers may have an "L-shape" in a cross-sectional view. As another example, the spacers 87 may be formed after the epitaxial source/drain regions 80 (shown in FIG. 14) are formed. In some embodiments, dummy spacers are formed on the first spacers (not shown) before the epitaxial process of the epitaxial source/drain regions 80 illustrated in FIGS. 14-16, and the dummy spacers are removed and replaced with the second spacers after the epitaxial source/drain regions 80 are formed. All such embodiments are fully intended to be included in the scope of the present disclosure.

Figure 14:
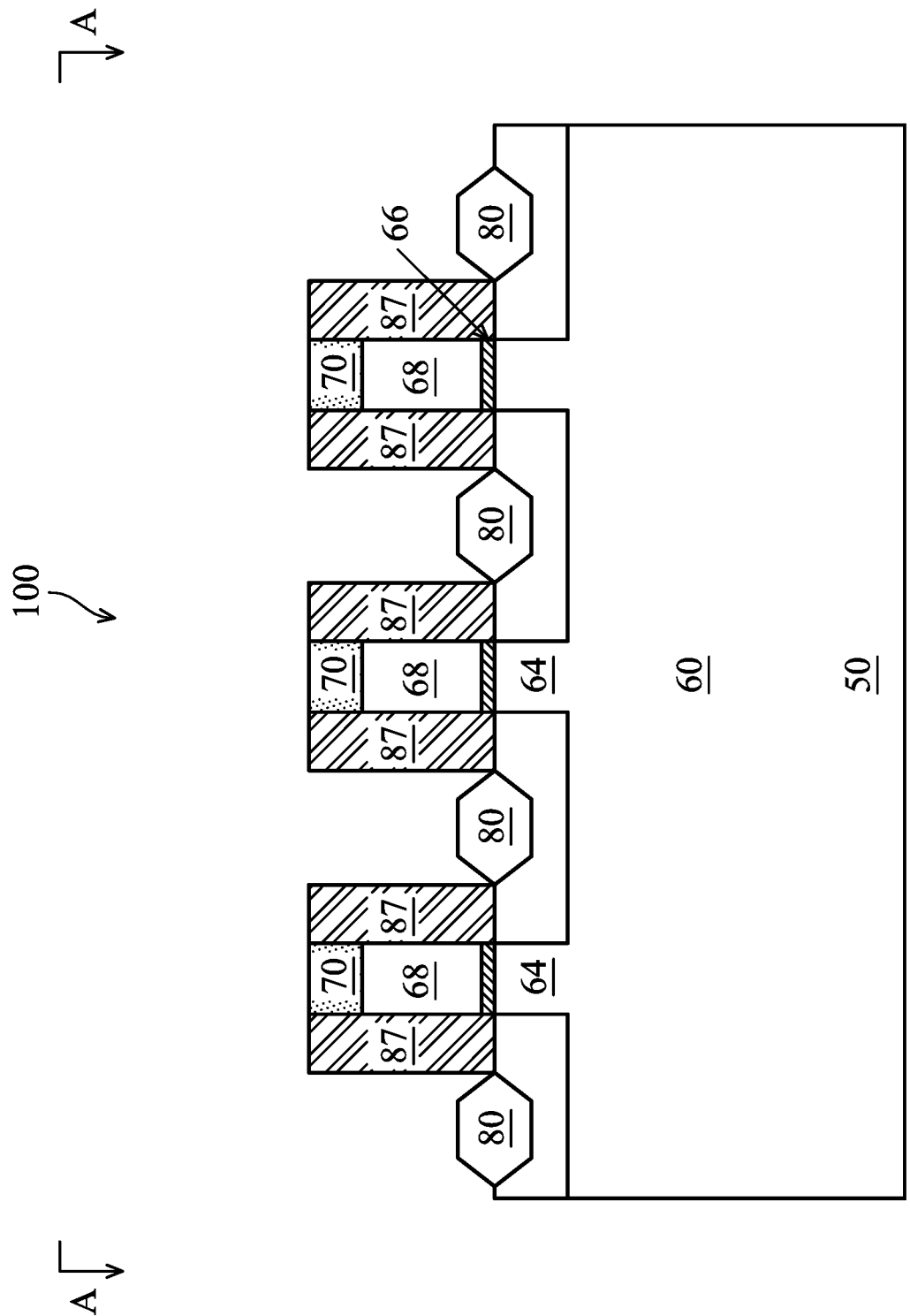
Figure 15:
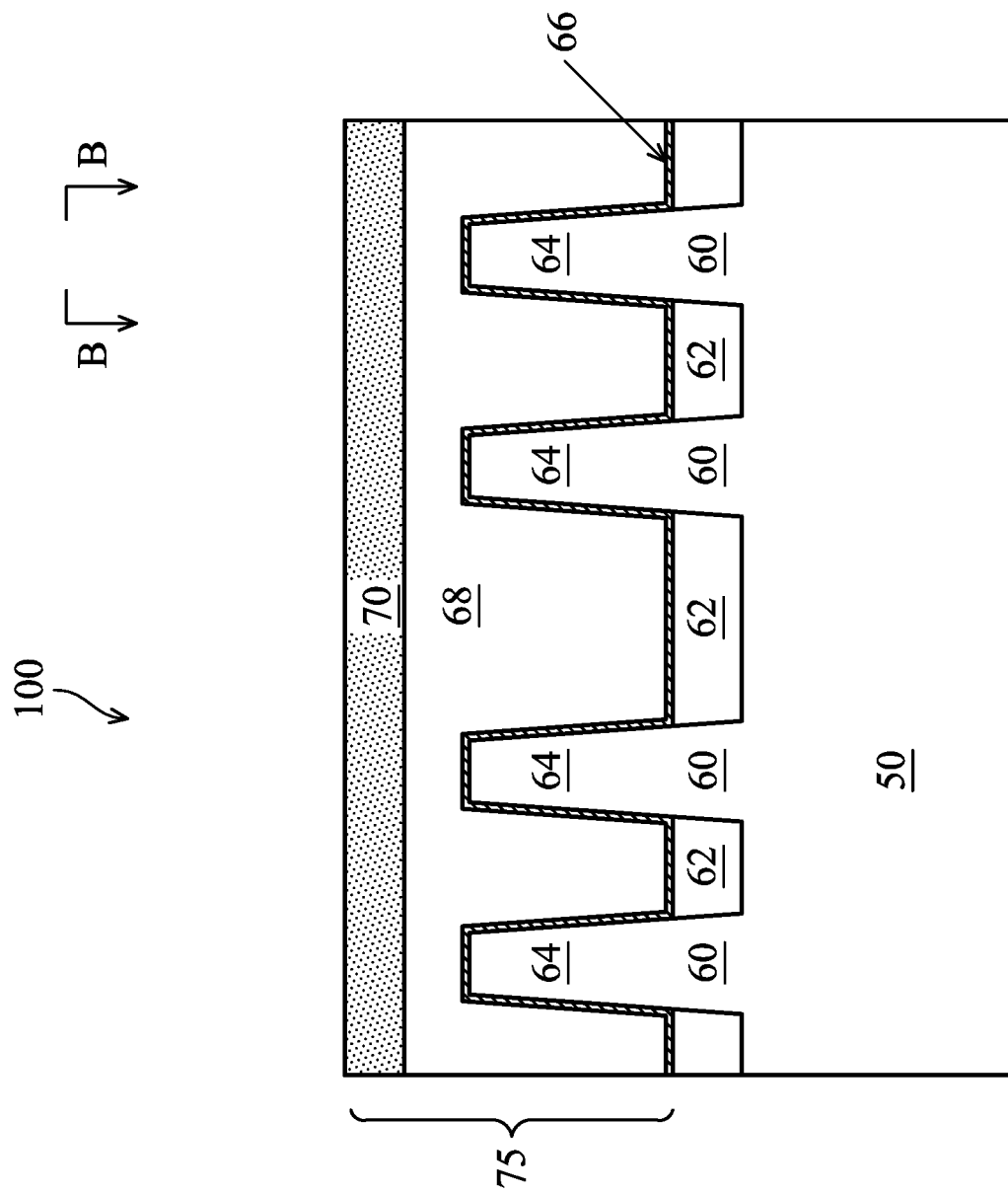
Figure 16:
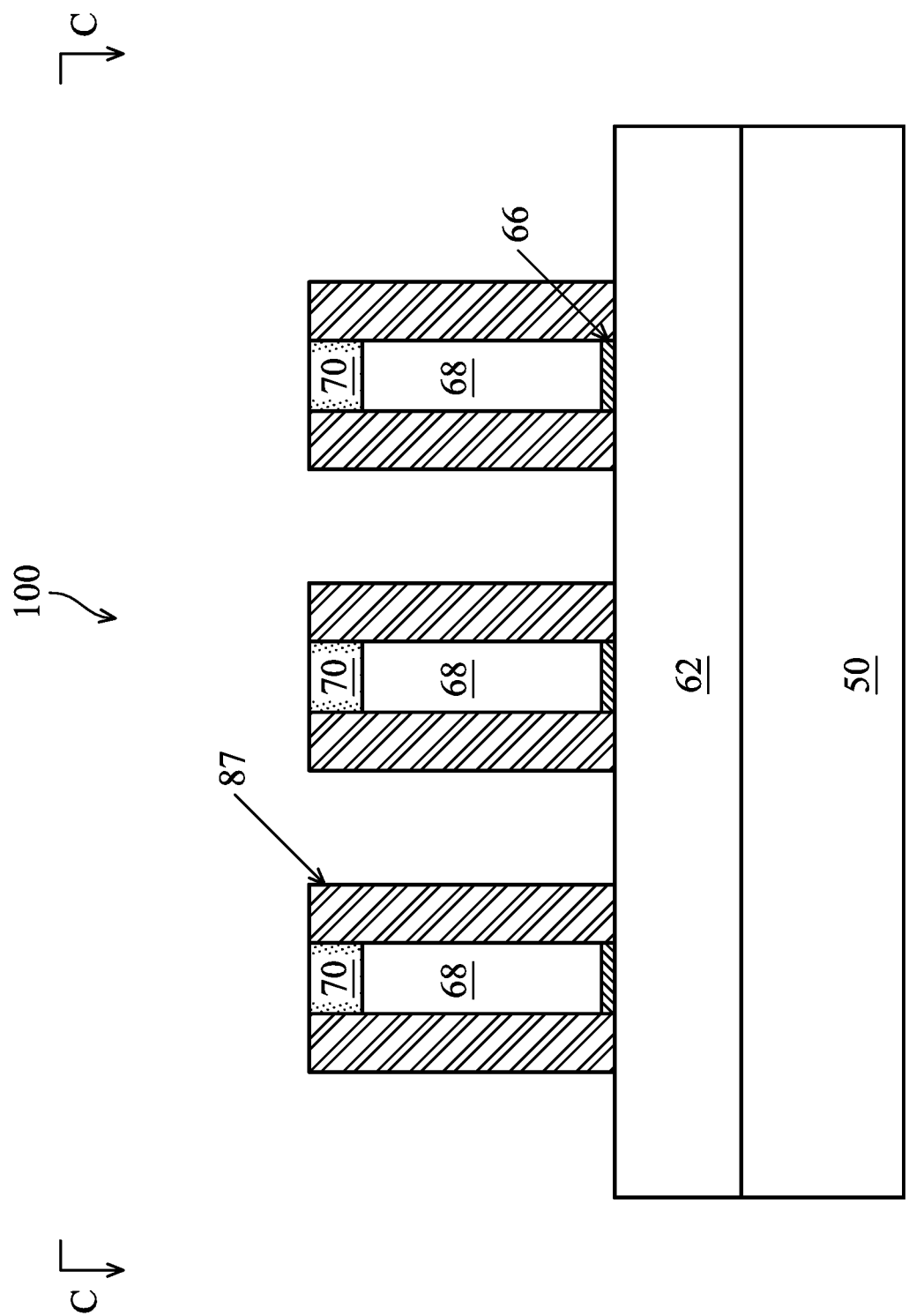

Next, as illustrated in FIGS. 14-16, source/drain regions 80 are formed. The source/drain regions 80 are formed by etching the fins 64 to form recesses, and epitaxially growing material in the recess. The epitaxial material of the source/drain regions 80 may be grown using suitable methods such as metal-organic CVD (MOCVD), molecular beam epitaxy (MBE), liquid phase epitaxy (LPE), vapor phase epitaxy (VPE), selective epitaxial growth (SEG), another process, or a combination thereof.

As illustrated in FIG. 14, the source/drain regions 80 may protrude above upper surfaces of the fins 64. In some cases, the source/drain regions 80 may have facets or may have irregular shapes. In some embodiments, the source/drain regions 80 of adjacent fins 64 do not merge together and remain separate source/drain regions 80. In other embodiments, the source/drain regions 80 of adjacent fins 64 may merge to form a continuous epitaxial source/drain region 80. In some embodiments in which the resulting FinFET is an n-type FinFET, source/drain regions 80 may include silicon carbide (SiC), silicon phosphorous (SiP), phosphorous-doped silicon carbon (SiCP), or the like. In some embodiments in which the resulting FinFET is a p-type FinFET, source/drain regions 80 may include silicon germanium (SiGe) and may include a p-type impurity such as boron (B) or indium (In).

In some embodiments, epitaxial source/drain regions 80 may be implanted with dopants. The implanting process may include forming and patterning masks such as a photoresist to cover the regions of the FinFET that are to be protected from the implanting process. In some embodiments, portions of the source/drain regions 80 may have a dopant concentration range between about 1 E19 $cm^{-3}$ and about 1 E21 $cm^{-3}$. In some embodiments, the epitaxial source/drain regions 80 may be in situ doped during epitaxial growth.

Figure 17:
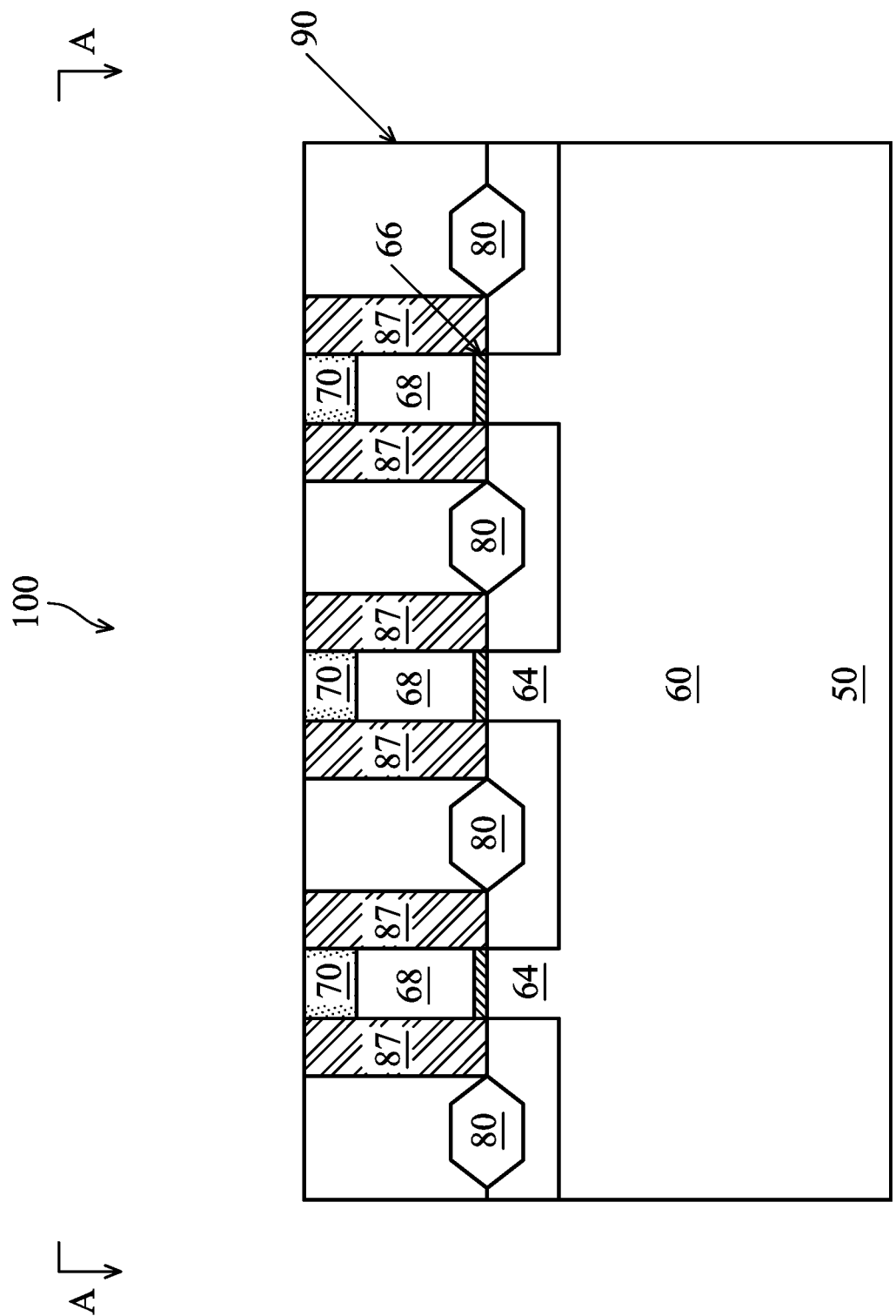
Figure 18:
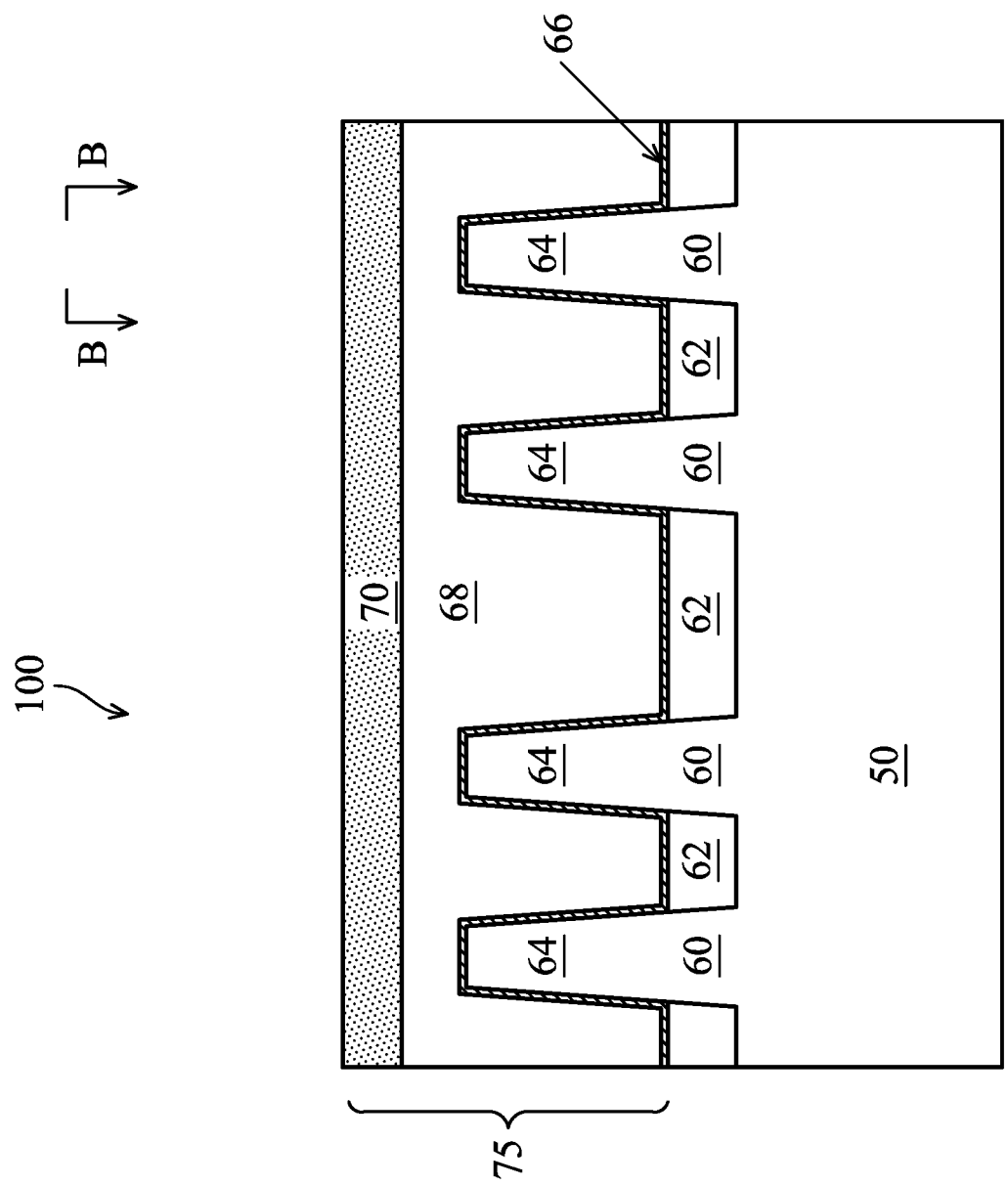
Figure 19:
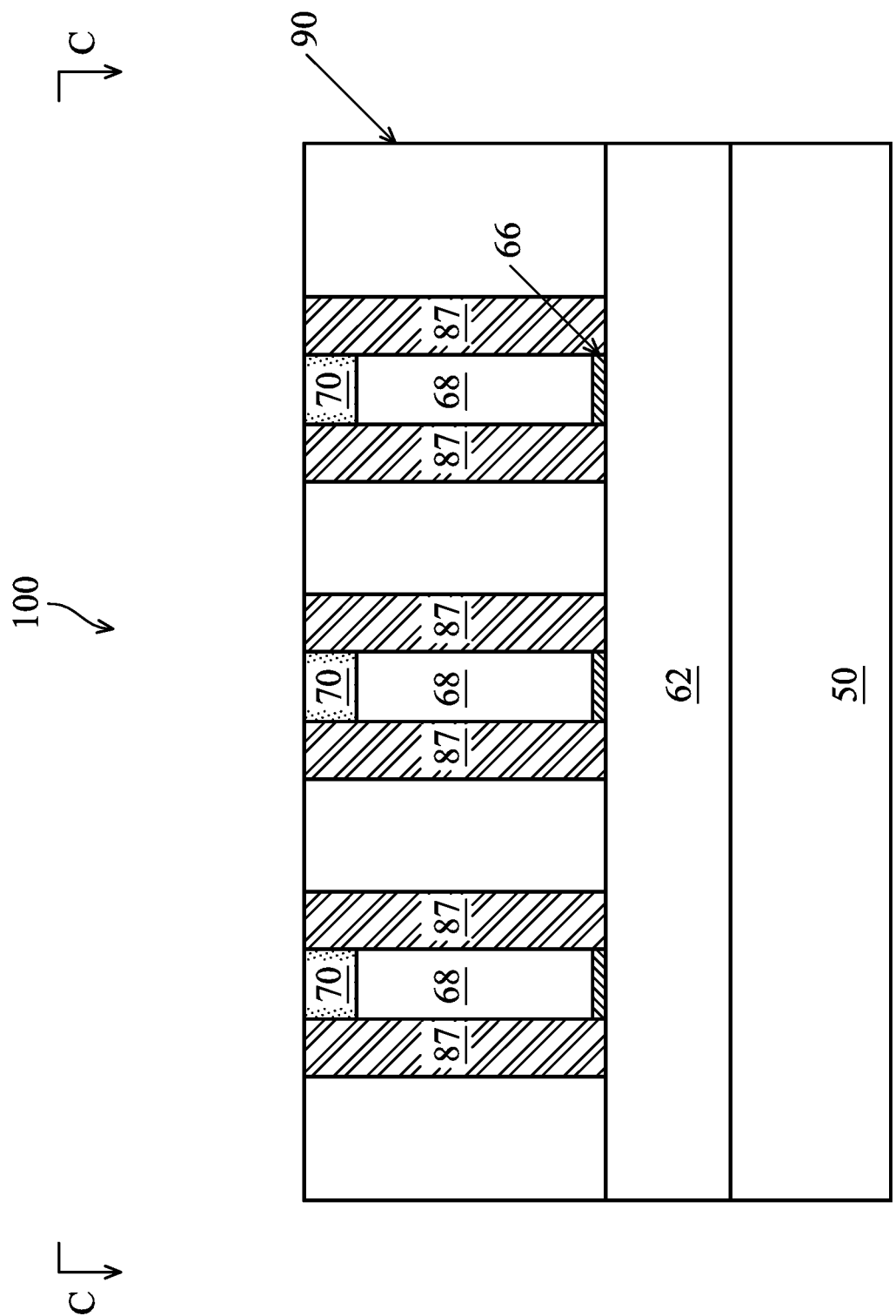

Next, as illustrated in FIGS. 17-25, an interlayer dielectric (ILD) 90 is formed over the FinFET as shown in FIGS. 17-19, and a gate-last process (sometimes referred to as replacement gate process) is performed. In a gate-last process, the dummy gate 68 and the dummy gate dielectric 66 are dummy structures that are removed as shown in FIGS.

Figure 23:
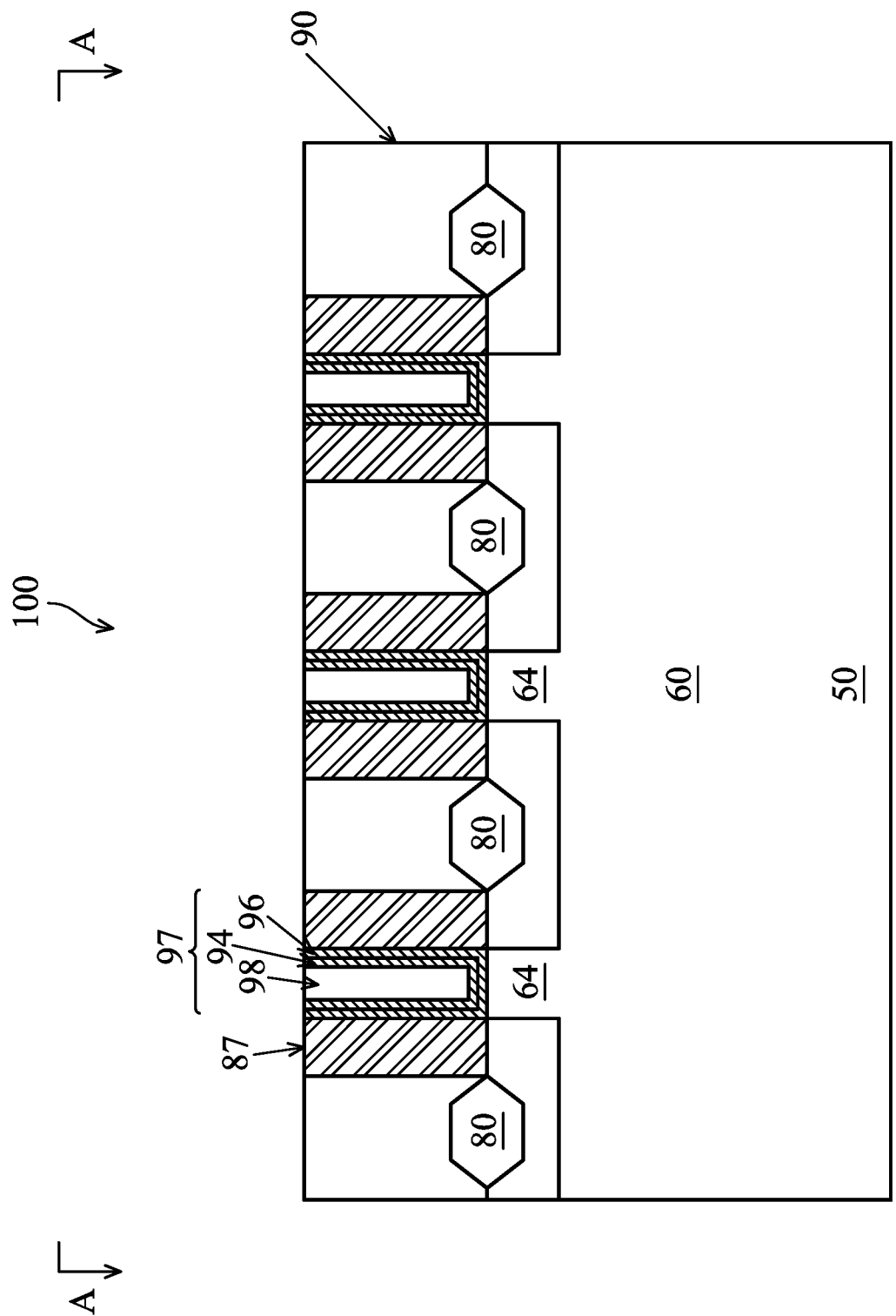
Figure 24:
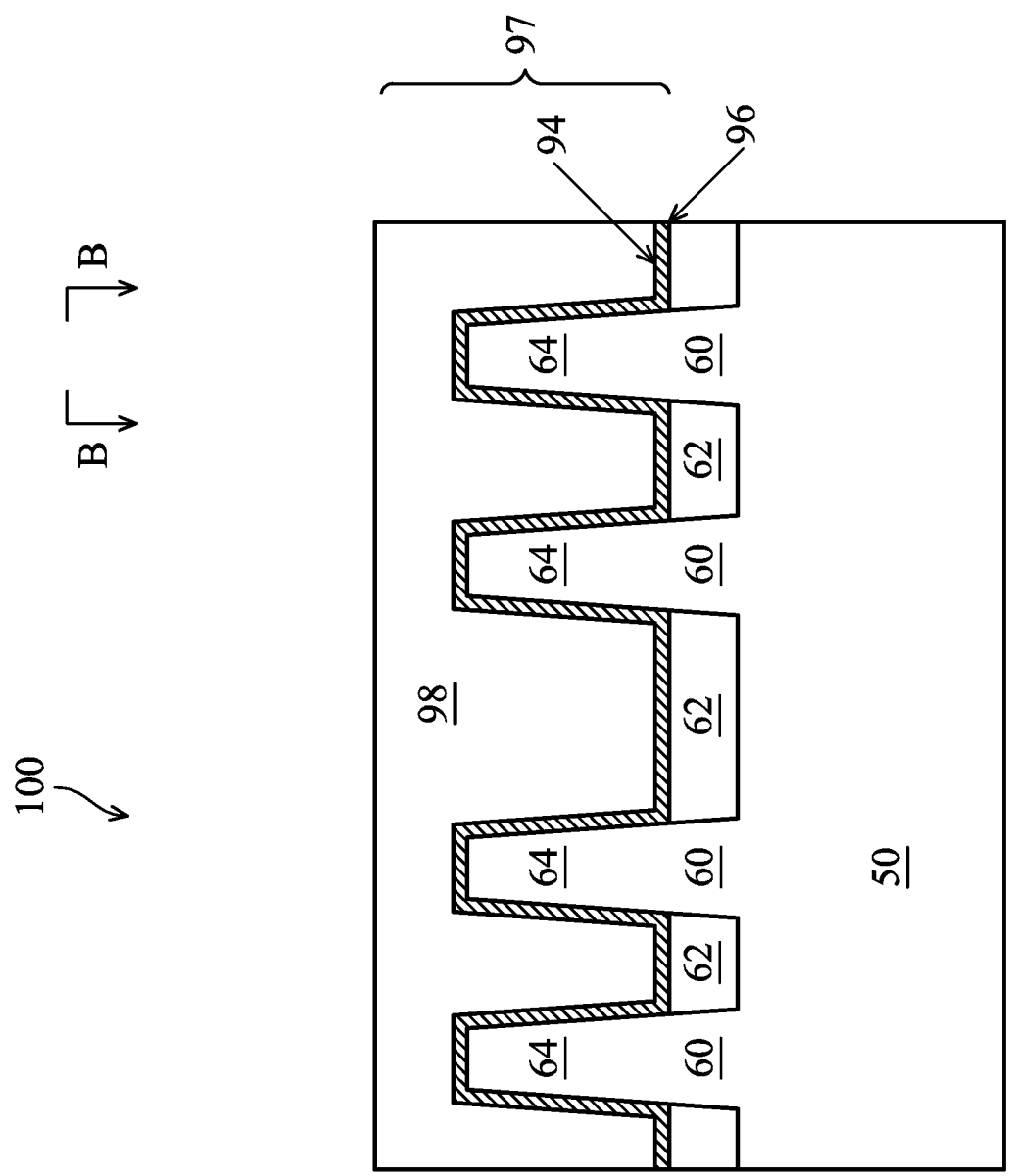
Figure 25:
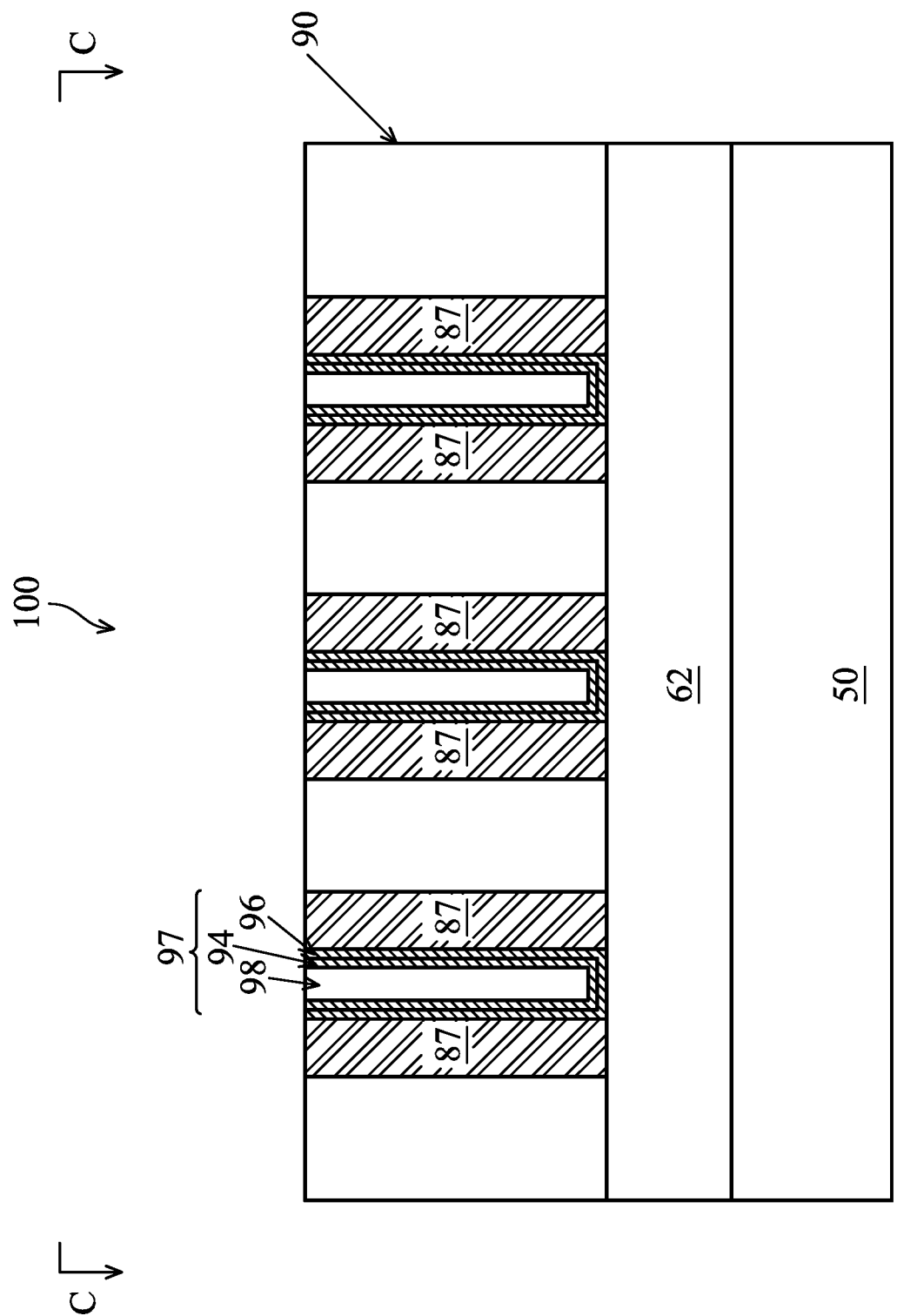

20-22 and replaced with an active gate and active gate dielectric, which may be collectively referred to as a replacement gate or a metal gate structure (such a replacement gate 97 shown in FIGS. 23-25).

In FIGS. 17-19, the ILD 90 is formed. In some embodiments, the ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the ILD 90, as shown in FIG. 17. In some embodiments, some or all of the mask 70 is removed by the CMP process. In some embodiments, a top surface of the dummy gate fill 68 is exposed after the CMP process.

Figure 20:
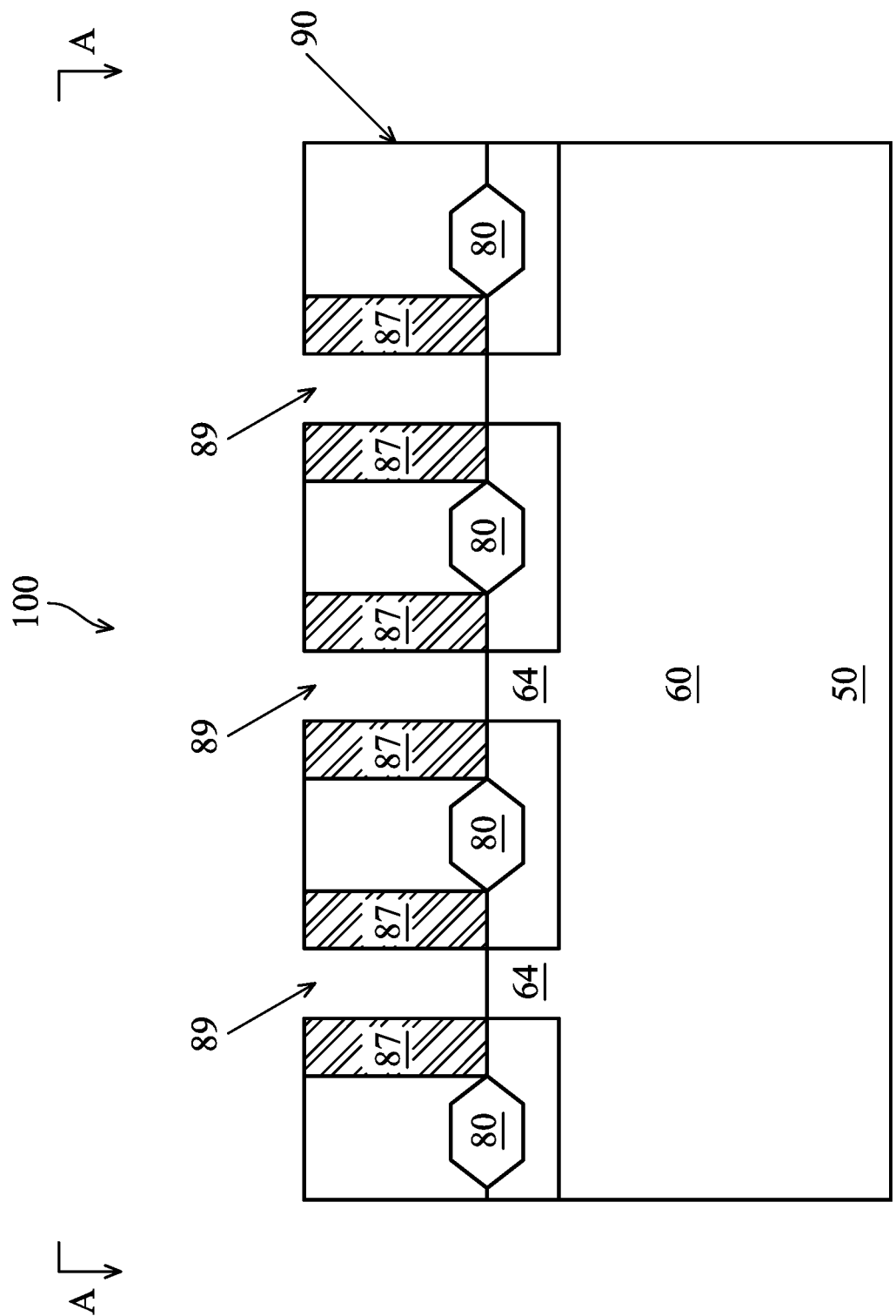
Figure 21:
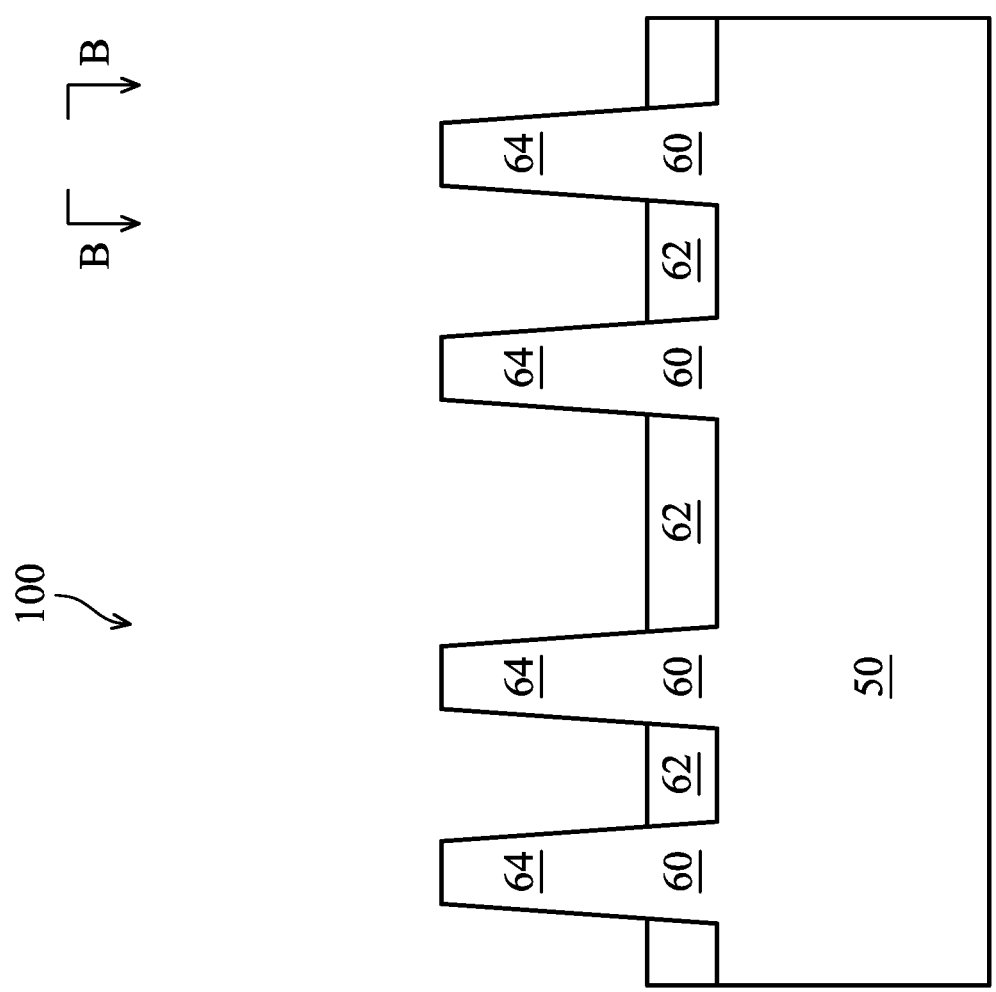
Figure 22:
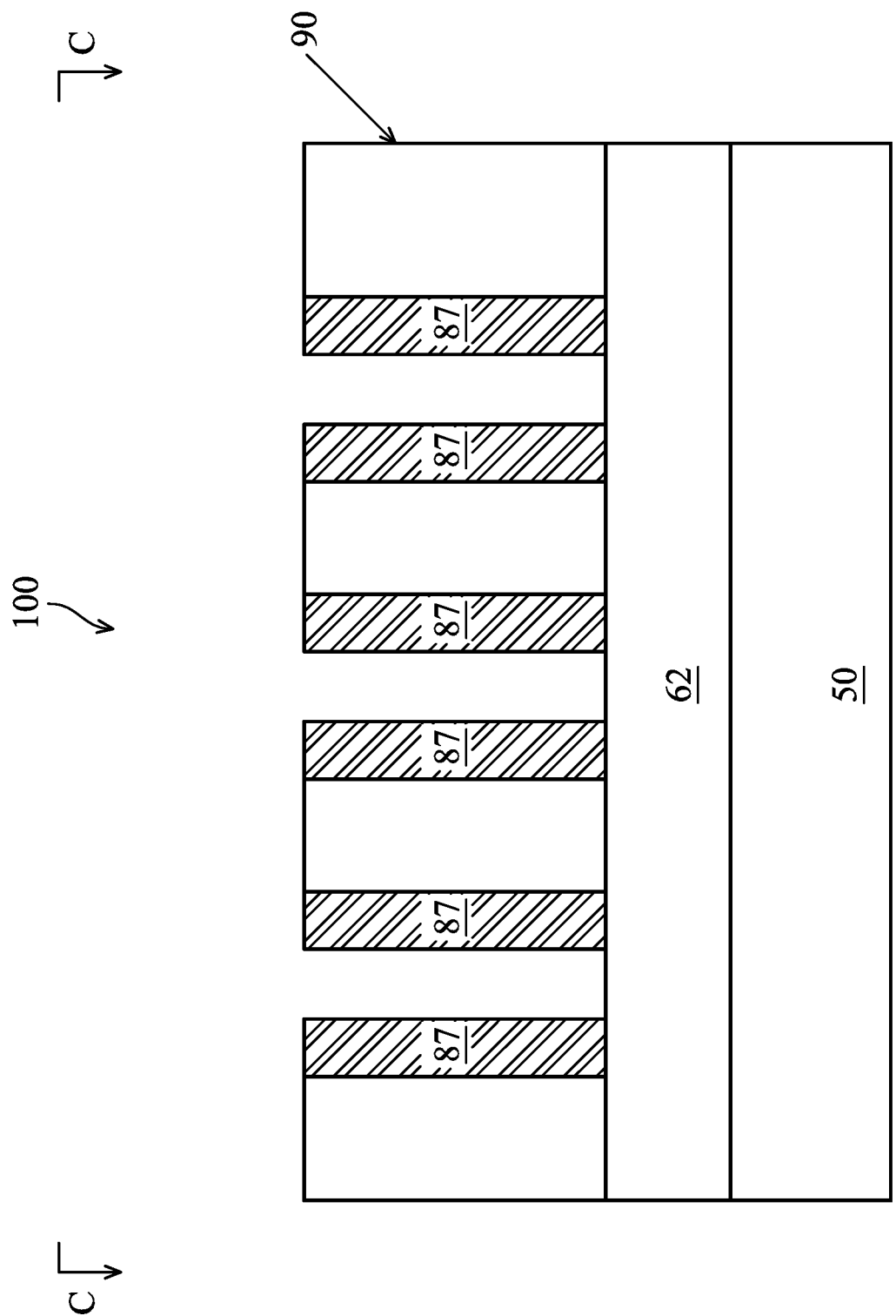

Next, in FIGS. 20-22, the mask 70 (if present), the dummy gate fill 68, and the dummy gate dielectric 66 are removed in one or more etching steps, so that recesses 89 are formed between respective spacers 87. Each recess 89 exposes a channel region of a respective fin 64. Each channel region may be disposed between neighboring pairs of epitaxial source/drain regions 80. In some cases, the dummy gate dielectric 66 may be used as an etch stop layer when the dummy gate fill 68 is etched. The dummy gate dielectric 66 may then be removed after the removal of the dummy gate fill 68.

In FIGS. 23-25, metal gates 97 are formed in the recesses 89 by forming a gate dielectric layer 96, a work-function layer 94, and a gate fill 98 successively in each of the recesses 89. As illustrated in FIGS. 23-25, the gate dielectric layer 96 is deposited conformally in the recesses 89. The work-function layer 94 is formed conformally over the gate dielectric layer 96, and the gate fill 98 fills the remainder of the recesses 89. Although not shown, a barrier layer may be formed between the gate dielectric layer 96 and the work-function layer 94.

In accordance with some embodiments, the gate dielectric layer 96 includes silicon oxide (SiO), silicon nitride (SiN), or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, other materials, or combinations thereof. The formation methods of gate dielectric layer 96 may include MBD, ALD, PECVD, or other processes.

Next, the barrier layer may be formed conformally over the gate dielectric layer 96. The barrier layer may include an electrically conductive material such as titanium nitride (TiN), although other materials may be used such as tantalum nitride (TaN), titanium (Ti), tantalum (Ta), the like, or combinations thereof. The barrier layer may be formed using a CVD process, such as plasma-enhanced CVD (PECVD). However, other processes, such as sputtering, metal organic chemical vapor deposition (MOCVD), atomic layer deposition (ALD), or other processes, may also be used.

The work-function layer 94 is formed conformally over the barrier layer. The work-function layer 94 may include one or more layers, and may include one or more suitable materials. The materials and layer thicknesses of the work-function layer 94 may be selected to adjust the threshold voltage (Vt) of the resulting FinFET in a predetermined manner. Exemplary p-type work-function metals that may be included in the metal gate 97 include TiN, TaN, Ru, Mo, Al, WN, $ZrSi_2$, $MoSi_2$, $TaSi_2$, $NiSi_2$, WN, other suitable p-type work-function materials, or combinations thereof. Exemplary n-type work-function metals that may be included in the metal gate 97 include Ti, Ag, TaAl, TaAlC, TiAlN, TaC, TaCN, TaSiN, Mn, Zr, other suitable n-type work-function materials, or combinations thereof. A work-function value is associated with the material composition of a work-function layer 94, and thus, the materials of the work-function layer 94 may be chosen to tune its work-function value so that a target threshold voltage (Vt) is achieved in the device that is to be formed in the respective region. The work-function layer 94 may be deposited by CVD, PVD, ALD, and/or other suitable process. N-type devices and p-type devices may have the same or a different number of work-function layers 94.

Next, the gate fill 98 is formed over the work-function layer 94. The gate fill 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work-function layer 94, and the material of the gate fill 98, which excess portions are over the top surface of the ILD 90. The resulting remaining portions of material of the gate fill 98, the work-function layer 94, and the gate dielectric layer 96 thus form metal gates 97 of the resulting FinFET device 100. It should be recognized that while FIG. 23 illustrates the FinFET device 100 with three metal gates 97, the FinFET device 100 could accommodate any number of metal gates. Furthermore, the metal gates may be in either a dense region or a sparse region. In some embodiments, the distance between two adjacent metal gates in the sparse region is greater than the distance between two adjacent metal gates in the dense region. Furthermore, the width of the metal gates in the sparse region is greater than the width of the metal gates in the dense region. In some embodiments, the width of the metal gates in the sparse region is at least two times greater than the width of the metal gates in the dense region.

Figure 26:
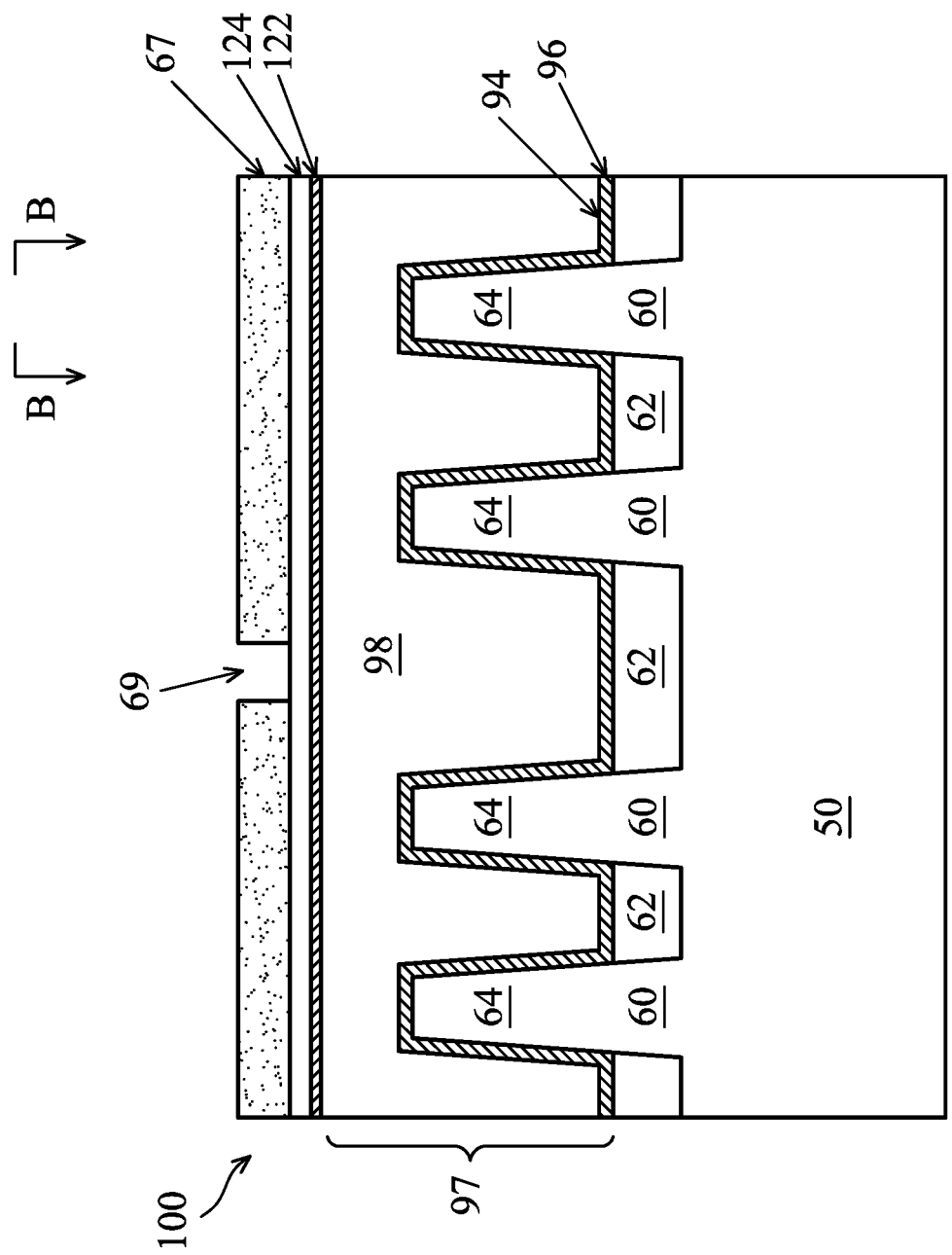
Figure 27:
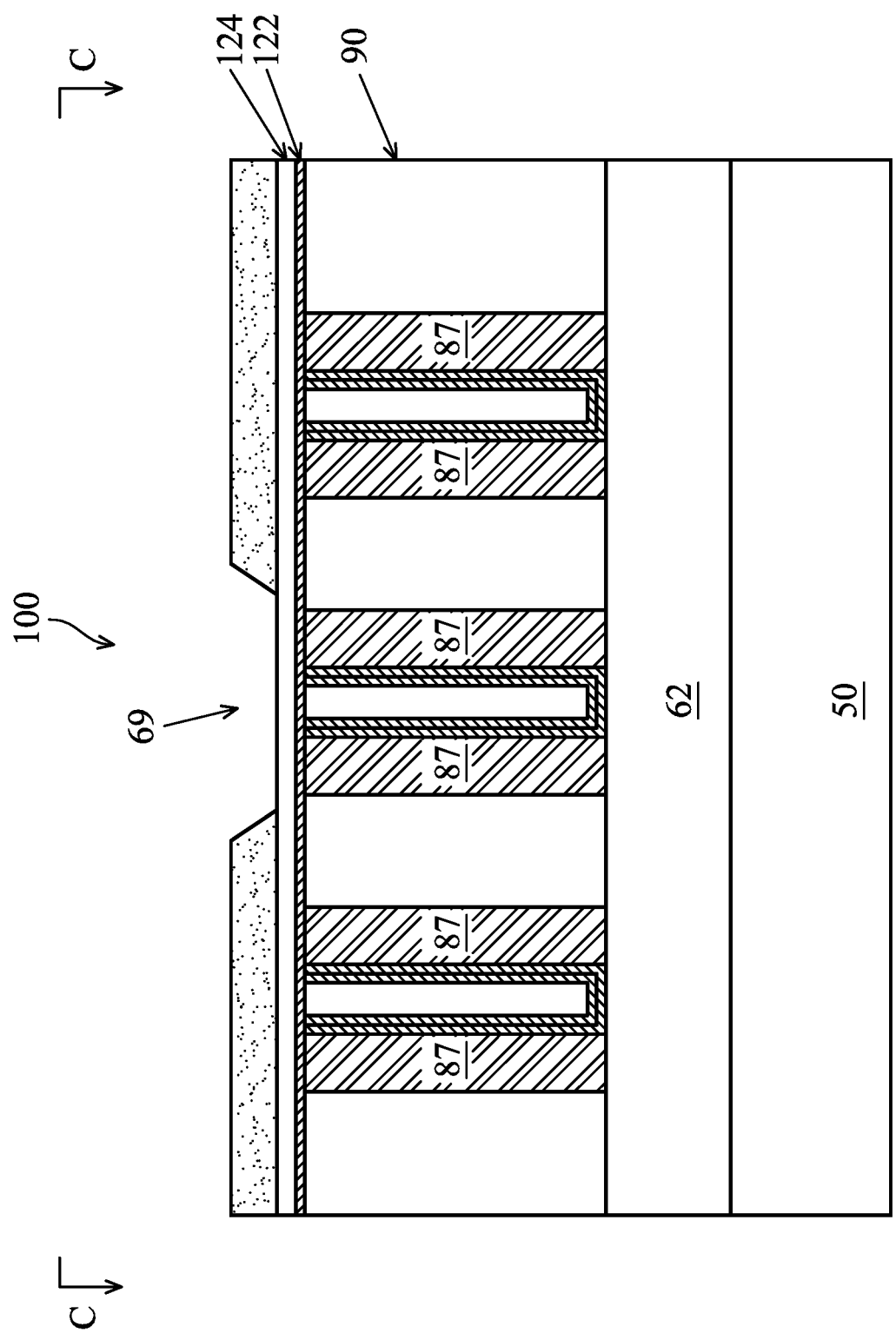

Details of metal gate cutting and fin isolation process are illustrated in FIGS. 26-39, in accordance with an embodiment. In FIGS. 26-27, a first hard mask layer 122 and a second hard mask layer 124 are formed consecutively over the FinFET device 100. Subsequently, a structure 67 is formed over the second hard mask layer 124. In some embodiments, the structure 67 is a tri-layer structure that includes a top photoresist layer, a middle layer, and a bottom anti-reflective coating (BARC) layer. Throughout the description, the structure 67 is alternatively referred to as the tri-layer structure 67.

In some embodiments, the first hard mask layer 122 is a metal hard mask layer and the second hard mask layer 124 is a dielectric hard mask layer. In subsequent processing steps, a pattern is transferred onto the first hard mask layer 122 using various photolithography and etching techniques. The first hard mask layer 122 may then be used as a patterning mask for etching the underlying structure (e.g., metal gates 97 or ILD 90). The first hard mask layer 122 may be a material such as titanium nitride, titanium oxide, the like, or a combination thereof. The first hard mask layer 122 may be formed using a process such as ALD, CVD, PVD, the like, or a combination thereof. In some embodiments, the first hard mask layer 122 may have a thickness between about 1 nm and about 10 nm. In some embodiments, the first hard mask layer 122 may function as an etching stop layer.

The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, $SiO_xC_y$, the like, or a combination thereof. The second hard mask layer 124 may be formed using a process such as CVD, ALD, the like, or a combination thereof. In an exemplary embodiment, the first hard mask layer 122 includes titanium nitride, and the second hard mask layer 124 includes silicon nitride. In some embodiments, the second hard mask layer 124 may have a thickness between about 35 nm and about 80 nm, such as about 68 nm.

The tri-layer structure 67 is formed over the second hard mask layer 124. In some embodiments, the tri-layer structure includes a BARC layer, a middle layer over the BARC layer and a top photoresist layer over the middle layer. The BARC layer of the tri-layered structure 67 may include an organic or inorganic material. The middle layer may include silicon nitride, silicon oxynitride, or the like. The middle layer may have an etch selectivity to the top photoresist layer, such that the top photoresist layer can be used as a mask layer to pattern the middle layer. The top photoresist layer may include a photosensitive material. Any suitable deposition method, such as PVD, CVD, spin coating, the like, or combinations thereof, may be used to form layers of the tri-layered structure 67.

As shown in FIGS. 26-27, once the tri-layer structure 67 is formed, a pattern is formed in the tri-layer structure 67. A pattern is shown in FIGS. 26-27 as an example opening 69. The opening 69 may be located between adjacent fins 64 and may extend across one or more metal gates 97. After the opening 69 is formed, a descumming process may be employed to trim the edges of the photoresist layer. Such a descumming process helps to improve the accuracy of the subsequent etching process.

Figure 28:
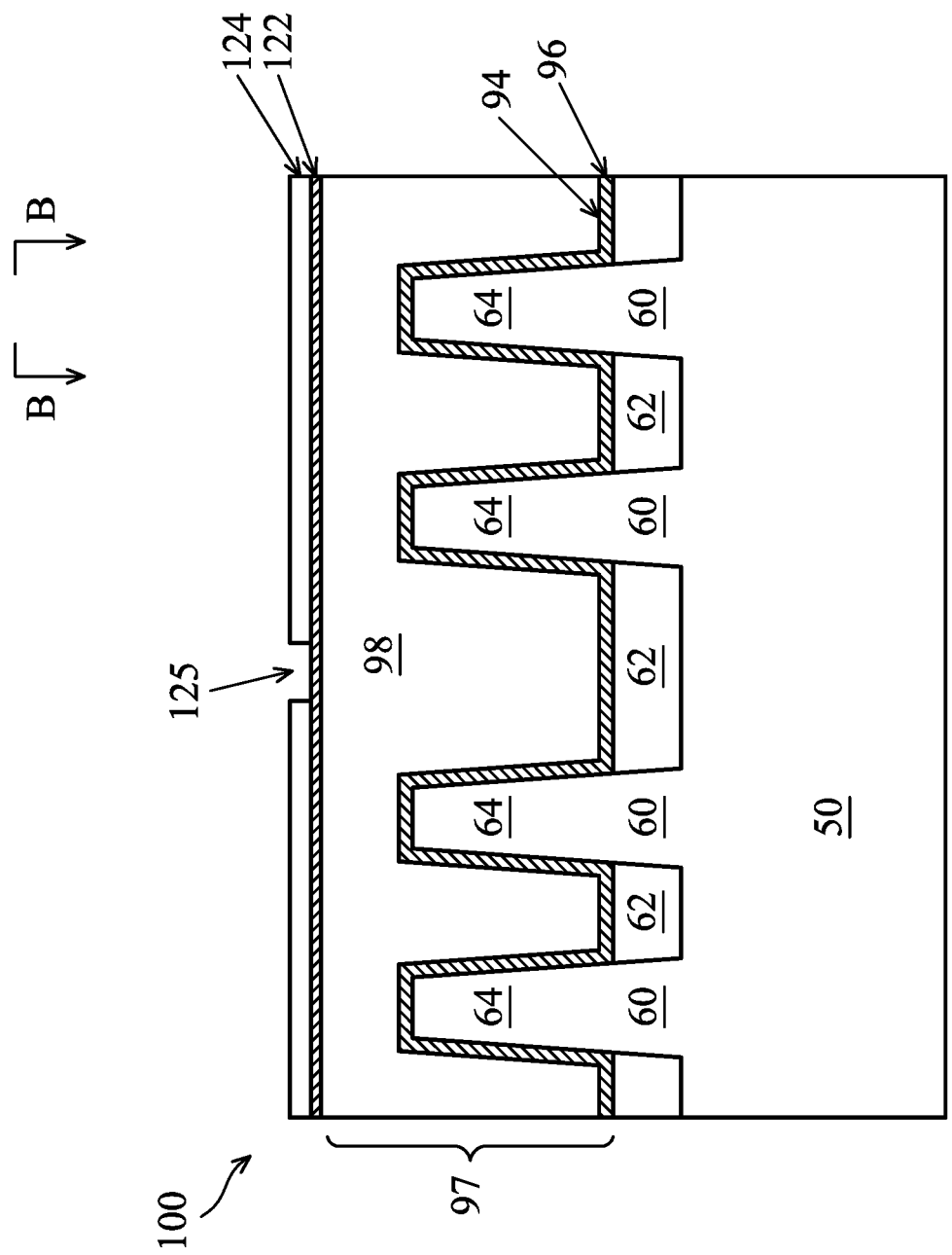
Figure 29:
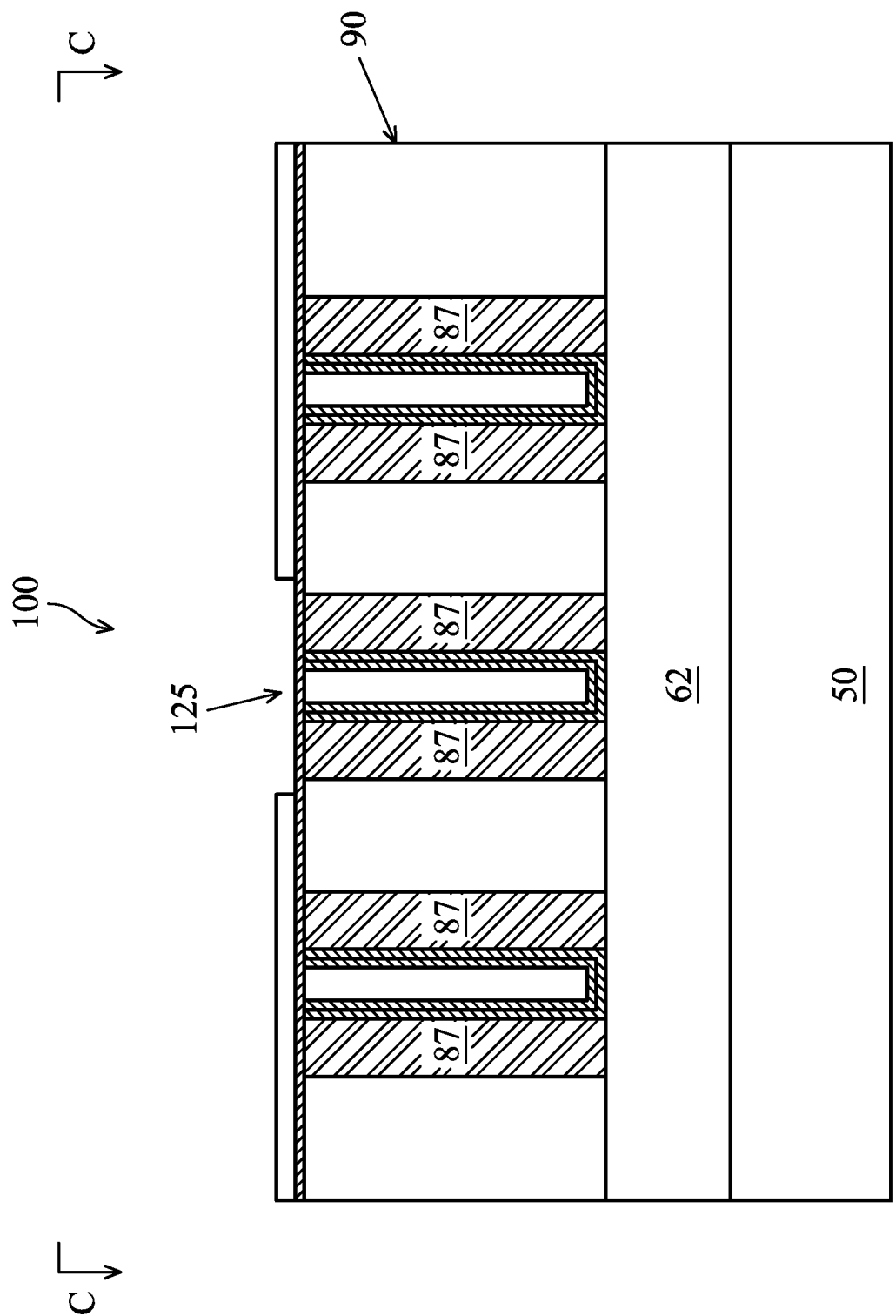

FIGS. 28-29 illustrate the etching of hard mask layer 124, in which the patterned photo resist 67 is used as an etching mask. Opening 125 thus extends into hard mask layer 124. The top surface of the first hard mask layer 122 is thus exposed to opening 125. Photo resist 67 is then removed. After the etching process applied to the hard mask layer 124 finishes, a wet clean process may be applied to the opening 125. The wet clean process helps to remove the residues in the opening 125. In some embodiments, acid and/or alkaline solutions are employed in the wet clean process.

Figure 30:
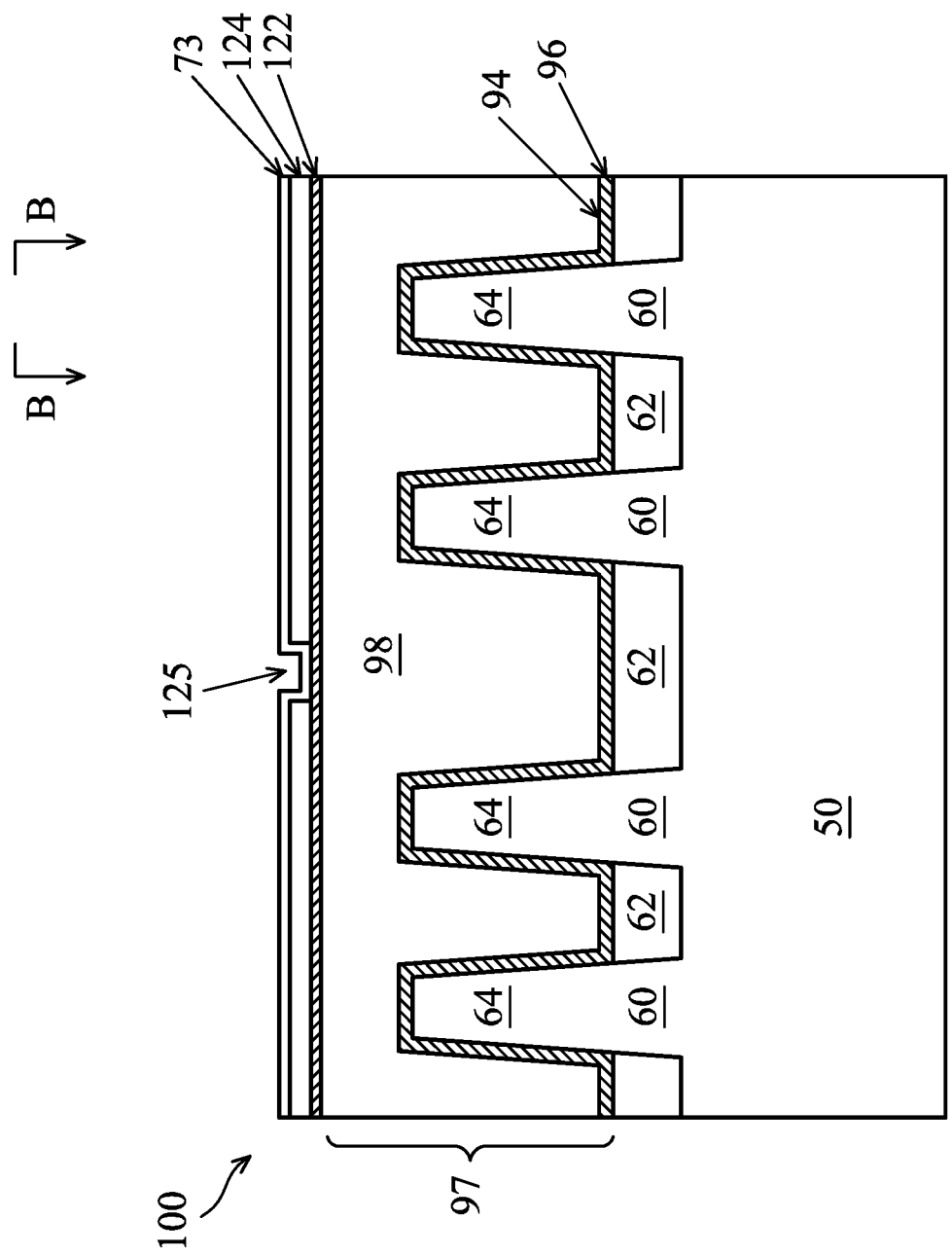
Figure 31:
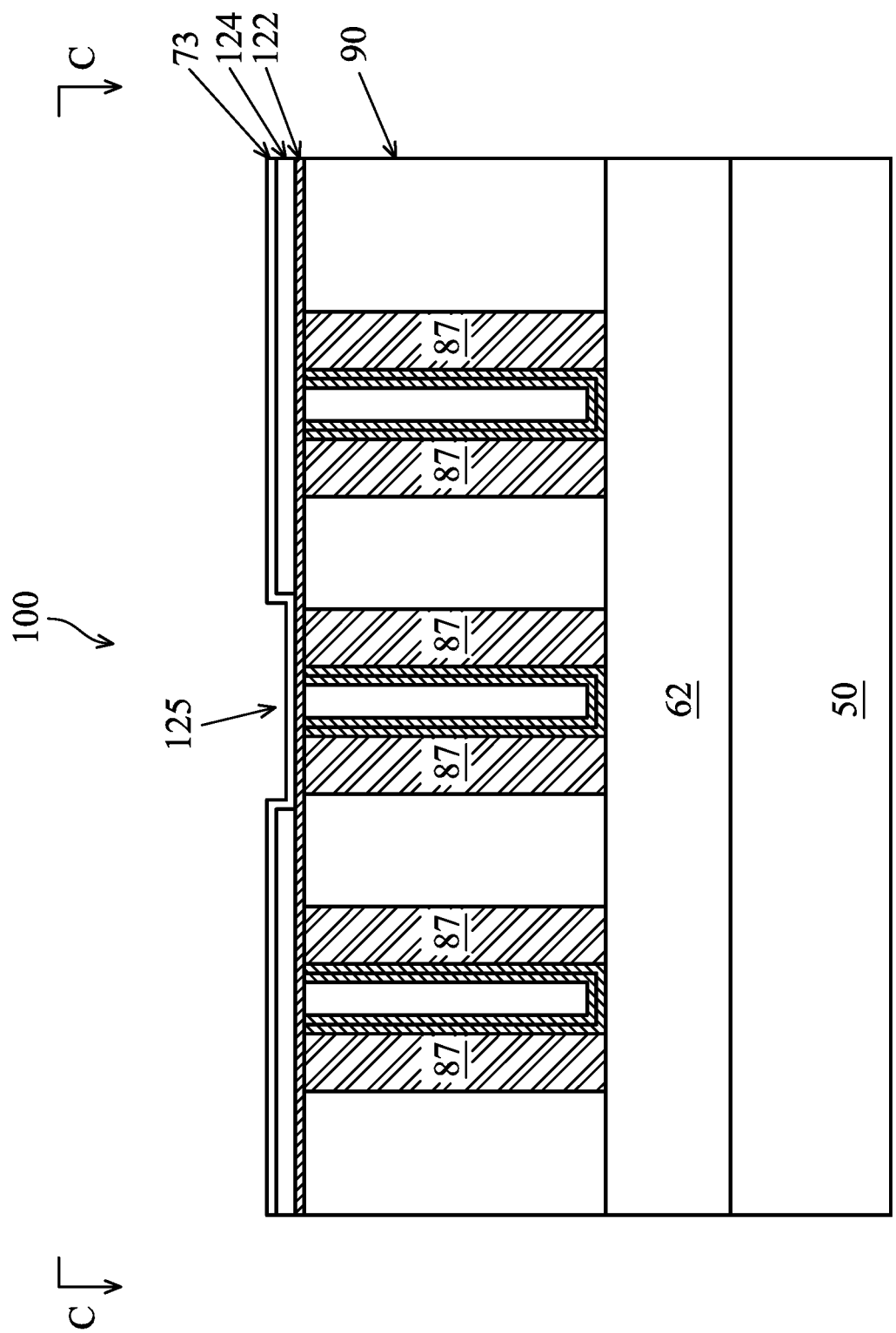

FIGS. 30-31 illustrate the formation of hard mask layer 73 in accordance with some embodiments. In accordance with some embodiments of the present disclosure, hard mask layer 73 is formed of a same material as that of hard mask layer 124, which may be SiN, for example. Hard mask layer 73 may also be formed of a different material than that of hard mask layer 124. Hard mask layer 73 is formed conformally, using, for example, ALD or CVD, so the thicknesses of the horizontal portions of and vertical portions of hard mask layer 73 are substantially equal to each other, for example, with a difference smaller than about 10 percent of the thickness of the horizontal portions. Hard mask layer 73 is formed to reduce the horizontal width of openings 125 (shown in FIGS. 28-29), so that the width of the subsequently formed isolation region is reduced. In accordance with alternative embodiments of the present disclosure, the formation of hard mask layer 73 is skipped.

Figure 32:
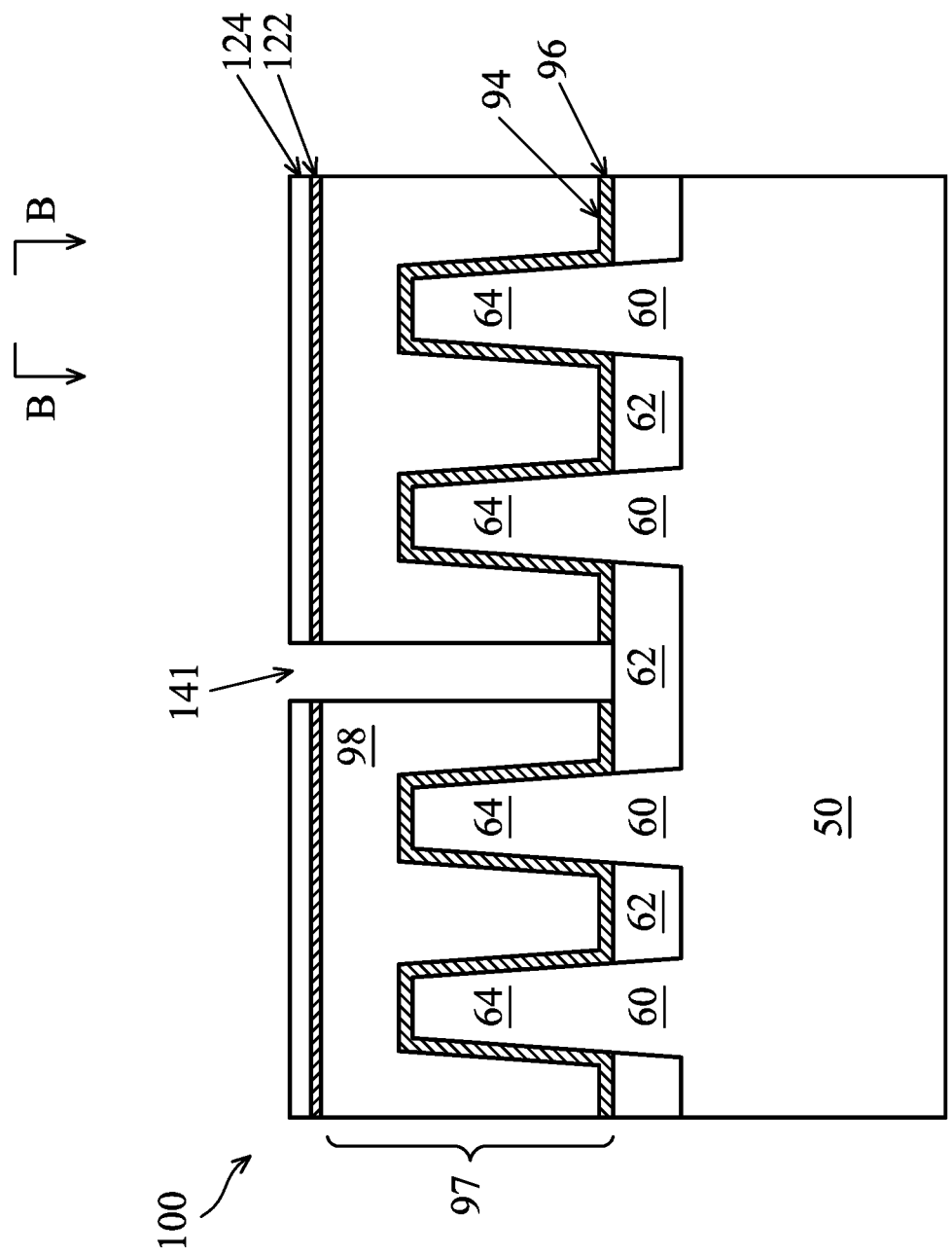
Figure 33:
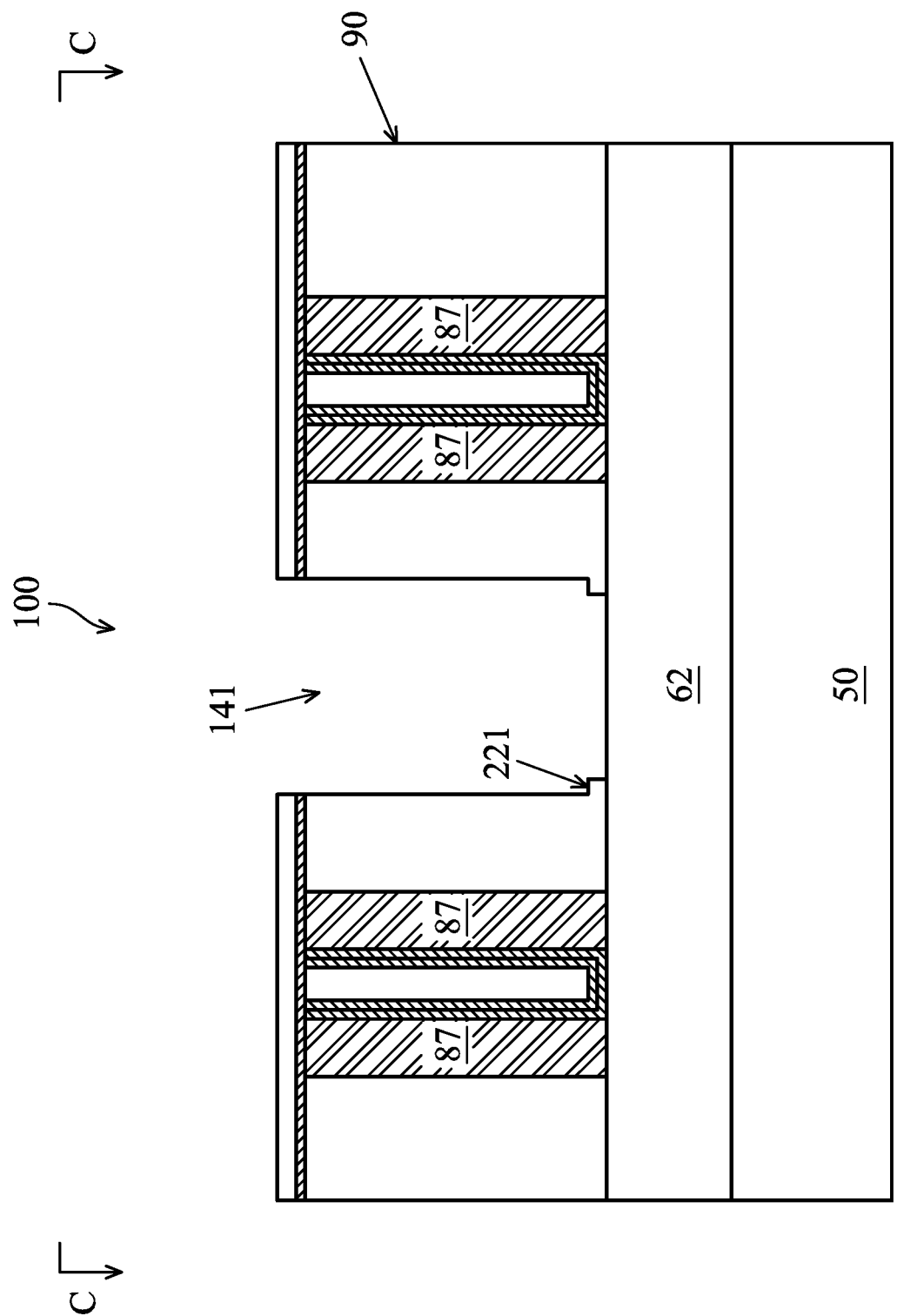

FIGS. 32-33 illustrate cross sectional views of the FinFET device 100 after the processes of removing the bottom portion of hard mask layer 73 and pad layer 122 in opening 125, and the formation of trench 141. The hard mask layer 73 may be removed in an anisotropic etching process, until pad layer 122 is exposed. Next, pad layer 122 and gate electrode 98 are etched to form trench 141, which extends to a top surface of the isolation regions 62. It should be noted that the trench 141 may also extend partially through the ILD layer 90. In some embodiments, the bottommost surface of the trench 141 in the ILD layer 90 is higher than the bottommost surface of the trench 141 shown in FIG. 33. In other words, the bottommost surface of the trench 141 in the ILD layer 90 is higher than the top surface of the isolation regions 62.

In accordance with some embodiments of the present disclosure, the etching is performed using process gases selected from, and not limited to, $Cl_2$, $BCl_3$, Ar, $CH_4$, $CF_4$, and combinations thereof. The etching of gate electrode 98 may be performed with a pressure in the range between about 2.5 mTorr and about 25 mTorr. An RF power is applied in the main etching, and the RF power may be in the range between about 250 Watts and about 2,500 Watts. A bias voltage in the range between about 25 volts and about 750 volts may also be applied. In some embodiments, the etching may be stopped when the bottom surface of trench 141 reaches the bottom surface of gate electrode 98 as shown in FIG. 22. In alternative embodiments, the etching may be stopped when the bottom surface of trench 141 is at an intermediate level between a top surface and a bottom surface of isolation region 62. Furthermore, FIG. 33 shows the ILD layer 90 includes a step 221.

After forming trench 141, a plasma treatment process is applied to the sidewalls of trench 141. More particularly, the plasma treatment process is an $H_2$ plasma treatment process for healing the surface damages on the sidewalls of trench 141. In some embodiments, the $H_2$ plasma treatment process is carried out in a pre-treat process of filling the dielectric material in trench 141. In alternative embodiments, the $H_2$ plasma treatment process is carried out in the process of filling the dielectric material in trench 141. The details of the plasma treatment process of the sidewalls of trench 141 will be described below with respect to FIGS. 34-35.

Figure 34:
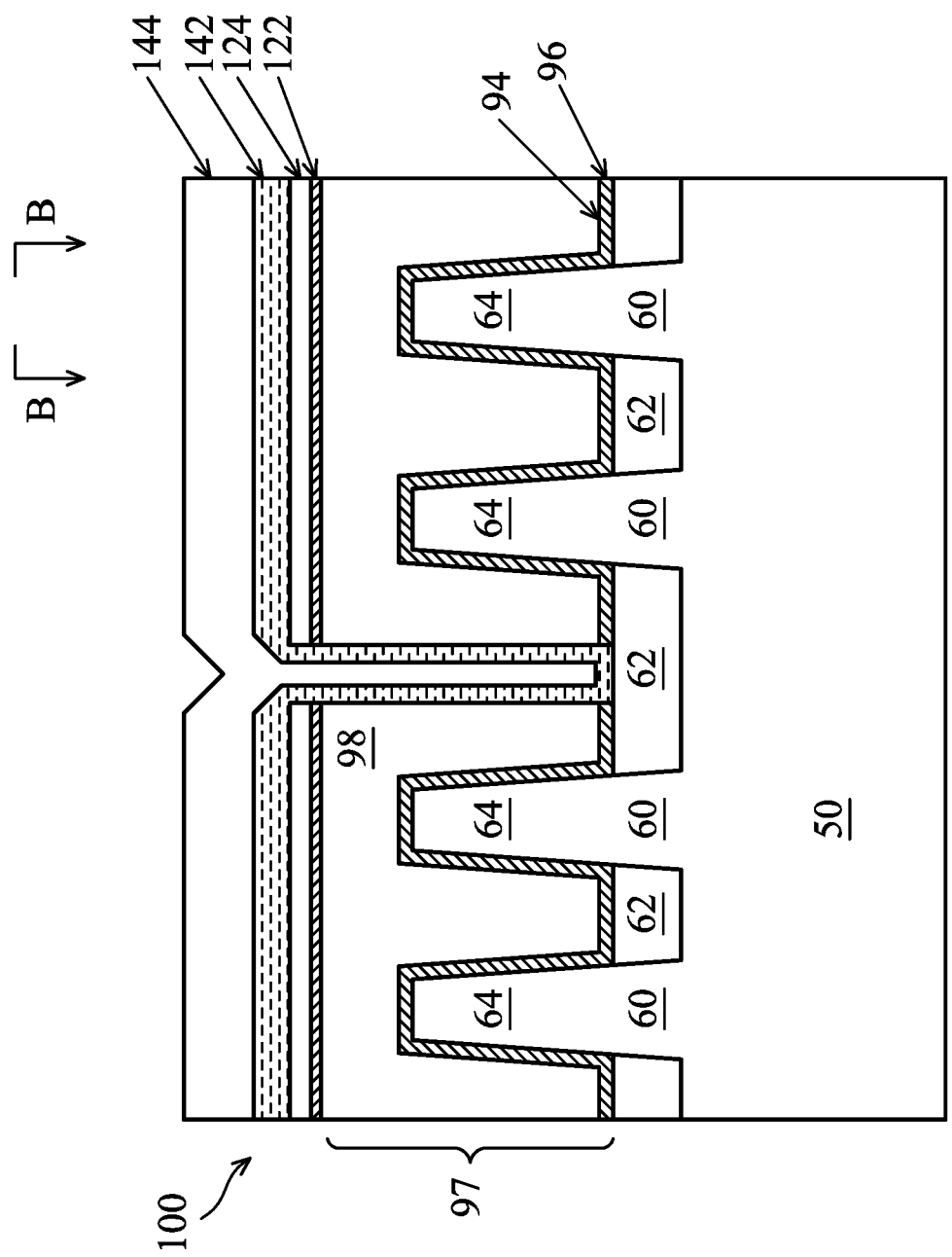
Figure 35:
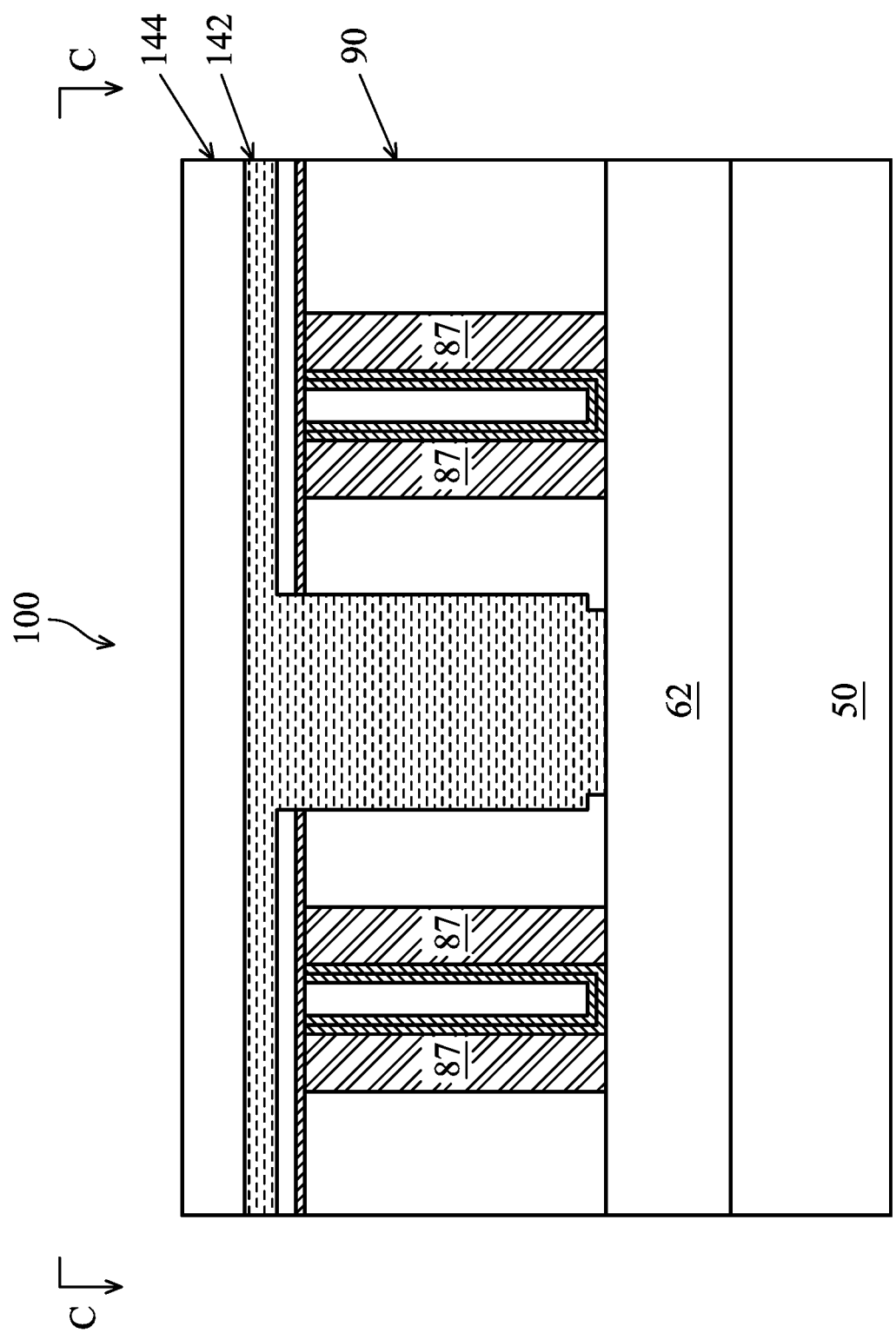

Next, as illustrated in FIGS. 34-35, trench 141 is filled by a dielectric material. In the illustrated example, trench 141 is filled by a first dielectric layer 142 and a second dielectric layer 144, which may or may not comprise a same dielectric material. Suitable materials for the first dielectric layer 142 and the second dielectric layer 144 may include silicon nitride, silicon oxynitride, silicon carbide, and the like, formed by PVD, CVD, ALD, or other suitable deposition method.

In some embodiments, the first dielectric layer 142 and the second dielectric layer 144 comprise a same material formed by different deposition methods. For example, the first dielectric layer 142 comprises silicon nitride formed by a plasma enhanced ALD (PEALD) process, and the second dielectric layer 144 comprises silicon nitride formed by the PECVD process.

In some embodiments, during each step of the PEALD process, a first $N_2$ gas, a second $N_2$ gas and an $H_2$ gas are supplied to the chamber of the PEALD process. The first $N_2$ gas functions as a reactant or purge gas. The second $N_2$ gas is a carrier gas. The second $N_2$ gas is employed to carry diiodosilane.

The PEALD process includes four steps. A first step is a source feed process. A second step is a first purge process. A third step is a RF ON process. A fourth step is a second purge process. In the PEALD process, a precursor comprising diiodosilane, an $N_2$ gas and an $H_2$ gas are supplied to the chamber of the PEALD process through various valves. A diiodosilane valve is turned on only at the first step and turned off at other steps. In other words, the precursor (diiodosilane) is supplied to the PEALD process only at the first step. An $N_2$ gas valve and an $H_2$ gas valve are turned on at all four steps. In other words, the $N_2$ gas valve and the $H_2$ gas are available at all four steps of the PEALD process. A radio frequency (RF) plasma is turned on at the third step, and turned off at other three steps. In the first step, the precursor comprising diiodosilane is supplied to the chamber in which the dielectric layers 142 and 144 are formed. Diiodosilane comprises $SiH_2I_2$. The precursor stays at the sidewalls of the trench 141 through an adsorption process. In the second step, the first $N_2$ gas is applied to the sidewalls of trench 141. The first $N_2$ gas functions as a purge gas to remove unabsorbed diiodosilane. In the third step, the RF source is turned on and a $N_2$ plasma treatment (the first $N_2$ gas) is applied to the sidewalls of trench 141. The precursor reacts with the $N_2$ plasma to form a silicon nitride layer on the sidewalls of trench 141. During the third step, after the RF source has been turned on, the $H_2$ gas functions as an $H_2$ plasma treatment to cure the damages on the sidewalls of the trench 141. More particularly, during various fabrication processes (e.g., the etching process for forming the trench 141), a metal oxide material may be formed on the sidewalls of the trench 141. The metal oxide material is considered as damages on the sidewalls of trench 141. During the $H_2$ plasma treatment, the hydrogen plasma reacts with the metal oxide material to convert the metal oxide material into a metal material. In particular, the oxide portion of the metal oxide material is reduced through a reduction-oxidation reaction process generated by the $H_2$ plasma treatment. As a result of having the reduction-oxidation reaction process, the metal oxide material is converted into the metal material. As a result, the damages of the sidewalls of trench 141 have been cured. In the fourth step, the first $N_2$ gas is used to remove the unreacted materials on the sidewalls of trench 141 through a purge process. The unreacted materials include any suitable materials used in the PEALD process such as unreacted diiodosilane.

In some embodiments, the $H_2$ plasma treatment in the PEALD process may be applied to the sidewalls of trench 141 in an in-situ manner. In other words, the $H_2$ plasma treatment can be accomplished during the deposition of the first dielectric layer 142. In alternative embodiments, the $H_2$ plasma treatment and the deposition of the first dielectric layer 142 are two different PEALD processes occurred in the same chamber, namely a pre-treat PEALD process and a bulk PEALD process.

In some embodiments, the pre-treat PEALD process also includes four steps. The first step is the source feed process, which is alternatively referred to as a pre-cursor step. The pre-cursor is diiodosilane. The pre-cursor comprises $SiH_2I_2$. In some embodiments, the pre-cursor step is applied to the FinFETs about 2 seconds (in a range from 0.1 seconds to 10 seconds). The pre-cursor stays at the sidewall of the trench for about 2 seconds through an adsorption process, but does not react with the material of the trench.

The second step is the first purge process in which the extra pre-cursor material has been removed from the chamber. The first purge process is an $N_2$ purge process. In some embodiments, the first purge process is applied to the FinFETs about 1 second (in a range from 0.1 seconds to 10 seconds). The third step is the RF ON process, which is alternatively referred to as a nitridation step. During the nitridation step, after the RF source has been turned on, the silicon in the pre-cursor material reacts with the nitrogen ($N_2$) to from SiN. During the third step, after the RF source is turned on, the $H_2$ gas reacts with the metal oxide material to convert the metal oxide material into a metal material. In some embodiments, the nitridation step is applied to the FinFETs about 30 seconds (in a range from 10 seconds to 100 seconds). The fourth step is the second purge process in which the unreacted materials have been removed from the chamber. In some embodiments, the second purge process is applied to the FinFETs about 0.1 seconds (in a range from 0.1 seconds to 10 seconds). In some embodiments, the total number of cycles of applying the pre-treat PEALD process to the FinFET device is equal to 8, although more or less cycles may be used in some other embodiments.

During the pre-treat PEALD process, the chamber is set up according to the following parameters. The pressure of the chamber is about 22.5 T (in a range from 5 T to 50 T). The flow rate of the precursor material (diiodosilane) is 9 SLM (in a range from 1 SLM to 20 SLM). The precursor is supplied with an $N_2$ carrier gas (the second $N_2$ gas). The flow rate of the $N_2$ carrier gas is 9 SLM. The flow rate of the first $N_2$ gas (purge gas) is 31 SLM (in a range from 5 SLM to 50 SLM). For all steps, the flow rate of $H_2$ is 5 SCCM (in a range from 1 SCCM to 100 SCCM). During the plasma step, the power of the RF source applied to the chamber is about 800 W (in a range from 200 W to 1500 W and having a frequency of 13.56 MHz). It should be noted during the pre-treat PEALD process, a third $N_2$ gas is supplied to the chamber. The third $N_2$ gas is employed to protect the backside of the wafer. The flow rate of the third $N_2$ gas is about 0.2 SLM.

In some embodiments, the bulk PEALD process also includes four steps. The first step is the pre-cursor step. The pre-cursor is diiodosilane. In some embodiments, the pre-cursor step is applied to the FinFETs about 0.3 seconds (in a range from 0.1 seconds to 10 seconds). Similar to that in the pre-treat PEALD process, the pre-cursor is attached to the surface of the FinFETs through an adsorption process except that the time is reduced from about 2 seconds to about 0.3 seconds.

The second step is the first purge process in which the extra pre-cursor material has been removed from the chamber. In some embodiments, the first purge process is applied to the FinFETs about 1 second (in a range from 0.1 seconds to 10 seconds). The third step is the nitridation step. During the nitridation step, after the plasma is turned on, the silicon in the pre-cursor material reacts with the nitrogen ($N_2$) to form SiN. The SiN formed in the nitridation step is part of the first dielectric layer 142. In some embodiments, the nitridation step is applied to the FinFETs about 1.6 seconds (in a range from 0.1 seconds to 10 seconds). The fourth step is the second purge process in which the unreacted materials have been removed from the chamber. In some embodiments, the second purge process is applied to the FinFETs about 0.1 seconds (in a range from 0.1 seconds to 10 seconds). The bulk PEALD process is applied to the FinFETs repeatedly until the first dielectric layer 142 is formed. In some embodiments, the total number of cycles of applying the bulk PEALD process to the FinFET device is equal to more than total number of cycles of the pre-treat PEALD process. For example, the total number of cycles of applying the bulk PEALD process to the FinFET device is equal to 560, although more or less cycles may be used in some other embodiments.

During the bulk PEALD process, the pressure of the chamber is about 15 T (in a range from 5 T to 50 T). The flow rate of the precursor material (diiodosilane) is 9 SLM (in a range from 1 SLM to 20 SLM). The precursor is supplied with an $N_2$ carrier gas (second $N_2$ gas). The flow rate of first N₂ gas is 31 SLM (in a range from 5 SLM to 50 SLM). The flow rate of H₂ is 5 SCCM (in a range from 1 SCCM to 100 SCCM). During the plasma steps, the power of the RF source applied to the chamber is about 800 W (in a range from 200 W to 1500 W and having a frequency of 13.56 MHz). It should be noted during the bulk PEALD process, a third N₂ gas is supplied to the chamber. The third N₂ gas is employed to protect the backside of the wafer. The flow rate of the third N₂ gas is about 0.2 SLM.

The PEALD processes above are carried out in a temperature range of about 450 C (in a range from about 200 C to about 700 C). In some embodiments, the plasma used in the processes above is a direct capacitvely coupled plasma (CCP). The PEALD processes above are carried out with a shower head/susceptor gapping of about 12 mm (in a range from about 1 mm to about 100 mm). The composition of the refill SiN comprises 46.7% of silicon, 42.6% of nitrogen and 10.1% of oxygen. The percentage above is based on one kind of atom relative to the total number of atoms. The density of the refill SiN is about 2.92 g/cm³. The film stress of the refill SiN is about 0.05 GPa.

The embodiments of the present disclosure have some advantageous features. By healing the surface damages on the sidewalls of trench 141, the uniformity in the threshold voltage throughout the wafer is improved. Experimental results indicated that the cut-metal-gate process adversely causes the shift in threshold voltage. Experimental results also indicated that if the device is formed without healing the surface damages on the sidewalls of trench 141, the shift in the threshold voltages of the FinFETs may be about 28 mV or higher. With healing the surface damages on the sidewalls of trench 141 before filling the isolation regions, the shift in the threshold voltages of the FinFETs is reduced to about 14 mV. In alternative embodiments, the processes described above are applied to a 5 nanometer process (N5). With healing the surface damages on the sidewalls of trench 141 before filling the isolation regions, the shift in the threshold voltages of the FinFETs is reduced to about 10 mV. Furthermore, experimental results also indicated that if the device is formed without healing the surface damages on the sidewalls of trench 141, the breakdown voltages of the FinFETs may be in a range from about 4.5V to about 7V. With healing the surface damages on the sidewalls of trench 141 before filling the isolation regions, the breakdown voltages of the FinFETs is in a range from about 6V to about 7V.

By healing the surface damages on the sidewalls of trench 141, other performance parameters of the wafer are improved. Experimental results indicated that if the device is formed without healing the surface damages on the sidewalls of trench 141, the diluted hydrofluoric acid (DHF) etching rate of the first dielectric layer 142 is about 62.8 A/min. With healing the surface damages on the sidewalls of trench 141 before filling the isolation regions, the DHF etching rate of first dielectric layer 142 is about 26 A/min.

Furthermore, experimental results indicated that if the device is formed without healing the surface damages on the sidewalls of trench 141, the impurity (Chlorine) analysis from the X-ray report of first dielectric layer 142 is about 0.9%. With healing the surface damages on the sidewalls of trench 141 before filling the isolation regions, the impurity (Chlorine) analysis from the X-ray report of first dielectric layer 142 is about 0%. Moreover, experimental results indicated that if the device is formed without healing the surface damages on the sidewalls of trench 141, the stress of the first dielectric layer 142 is about 0.58 GPa. With healing the surface damages on the sidewalls of trench 141 before filling the isolation regions, the stress of the thin films is about 0.05 GPa.

As shown in FIG. 34, the first dielectric layer 142 partially fills trench 141. In particular, the middle portion of trench 141 is not filled by the first dielectric layer 142. The second dielectric layer 144 fills the middle portion of trench 141. In other words, at least one portion of the second dielectric layer 144 extends into the first dielectric layer 142.

Figure 36:
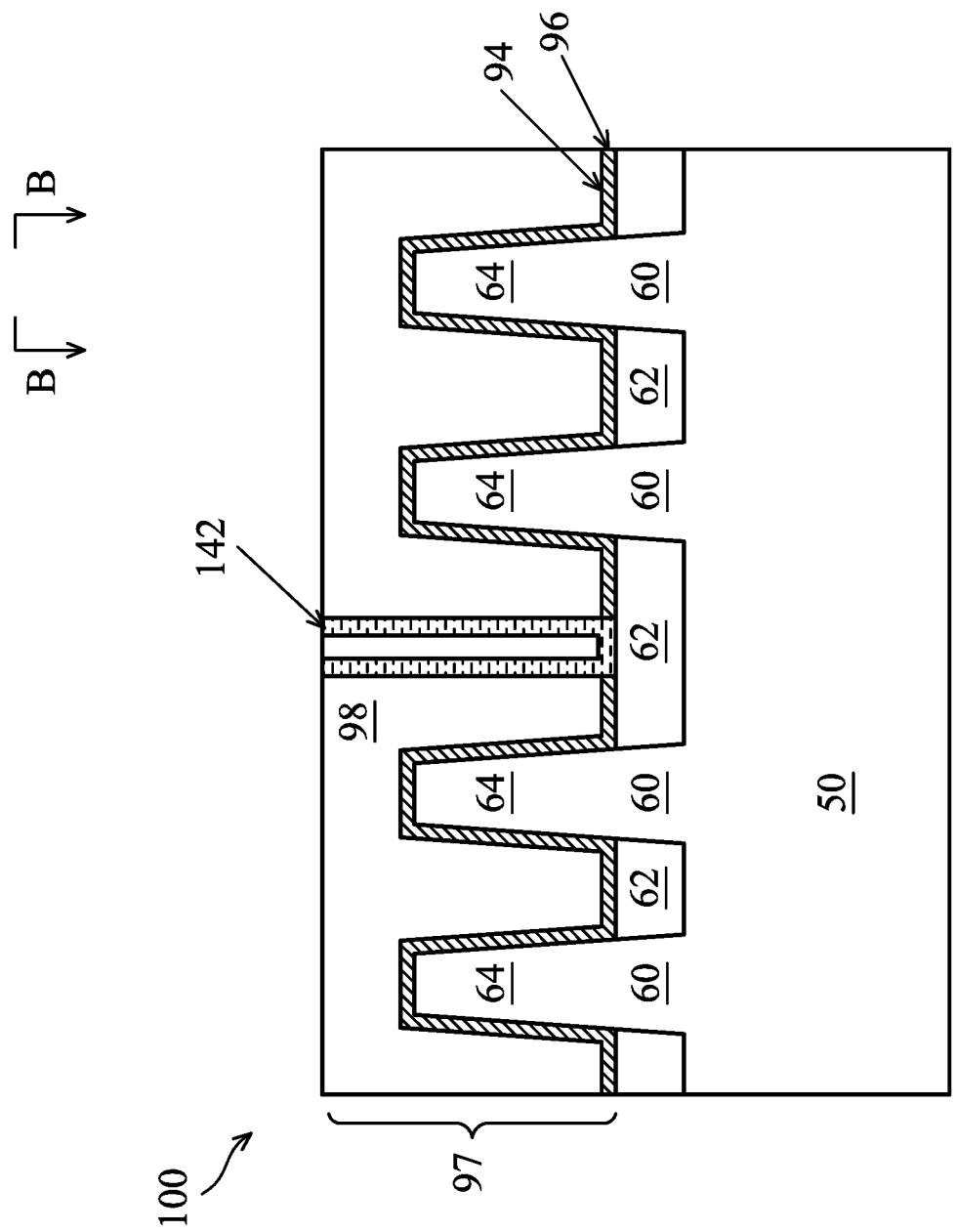
Figure 37:
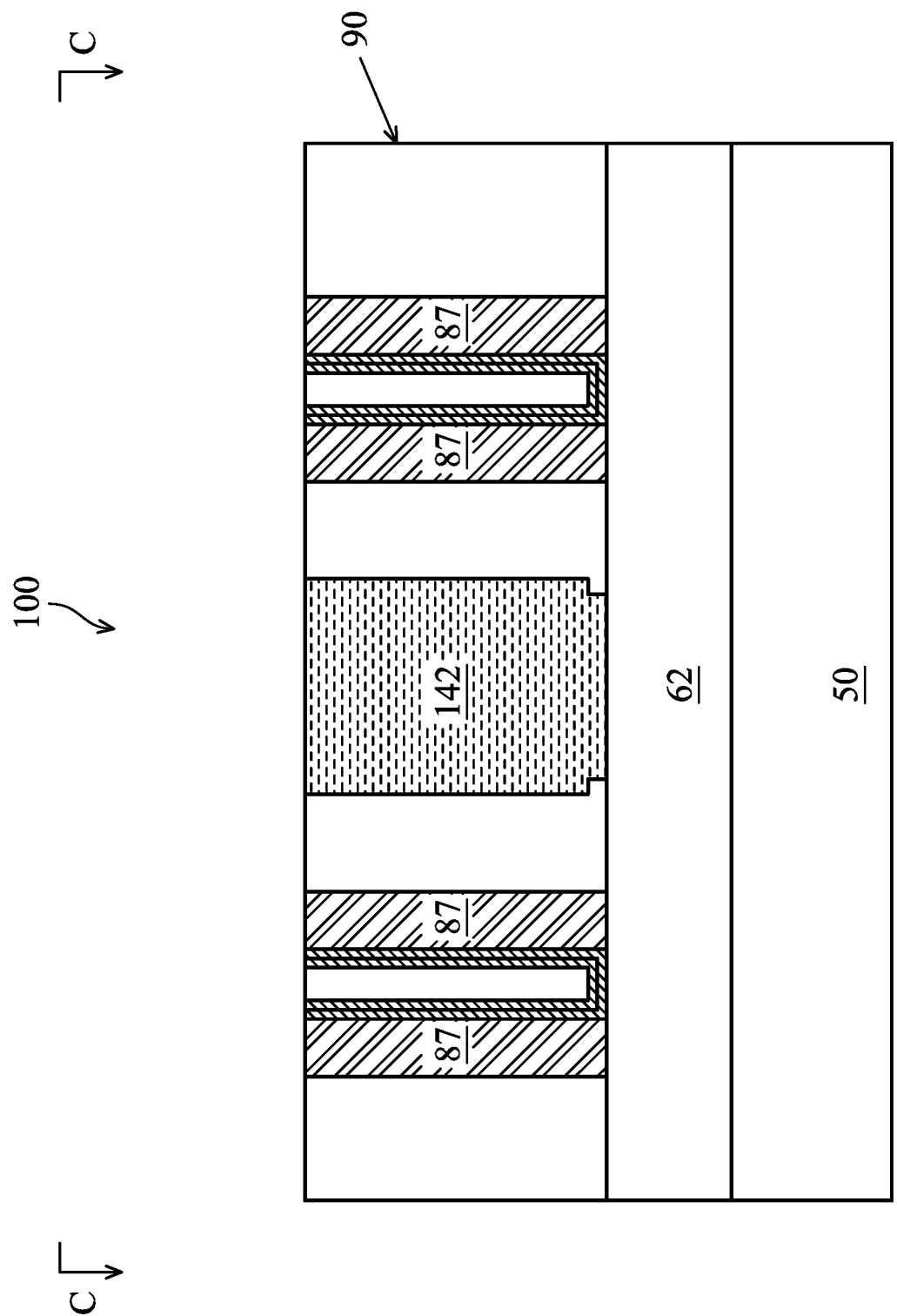

As illustrated in FIGS. 36-37, a planarization process, such as a CMP process, is performed to remove the first hard mask layer 122, the second hard mask layer 124, and excess portions of the dielectric layers 142 and 144. The planarization process may also remove portions of the gate fill 98.

Next, contacts (not shown) may be formed over and electrically connected to the metal gates, and contacts are formed over and electrically connected to the epitaxial source/drain regions. To form the contacts, a second ILD is formed over the ILD 90. In some embodiments, the second ILD is formed of a dielectric material such as PSG, BSG, BPSG, USG, or the like, and may be deposited by any suitable method, such as CVD and PECVD. In some embodiments, the second ILD is a flowable film formed by a flowable CVD method, but other techniques may be used. Contact openings are formed through the ILD 90 and/or the second ILD to expose the source/drain regions and the metal gates. The contact openings may be formed using any suitable photolithographic or etching techniques. The contact openings are then filled with electrically conductive material(s) to form the contacts. In some embodiments, silicide regions (not shown) are formed over the source/drain regions before the contact openings are filled, forming contacts.

Figure 38:
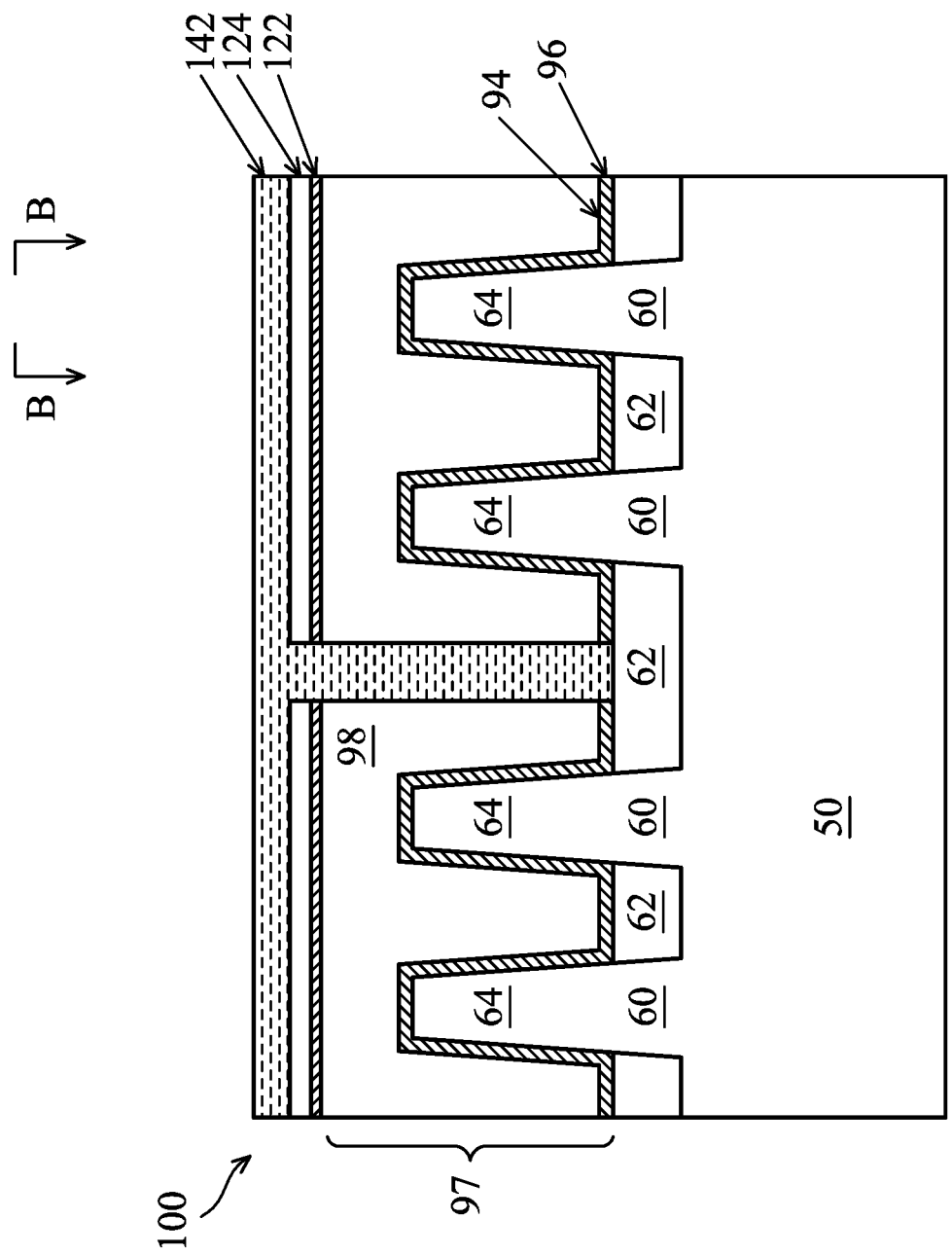

Next, as illustrated in FIG. 38, in another embodiment, trench 141 is filled by a dielectric material. In the illustrated example, trench 141 is filled by a single dielectric layer. The embodiment shown in FIG. 38 is similar to that shown in FIG. 34 except that a single dielectric material is employed to fill trench 141.

Figure 39:
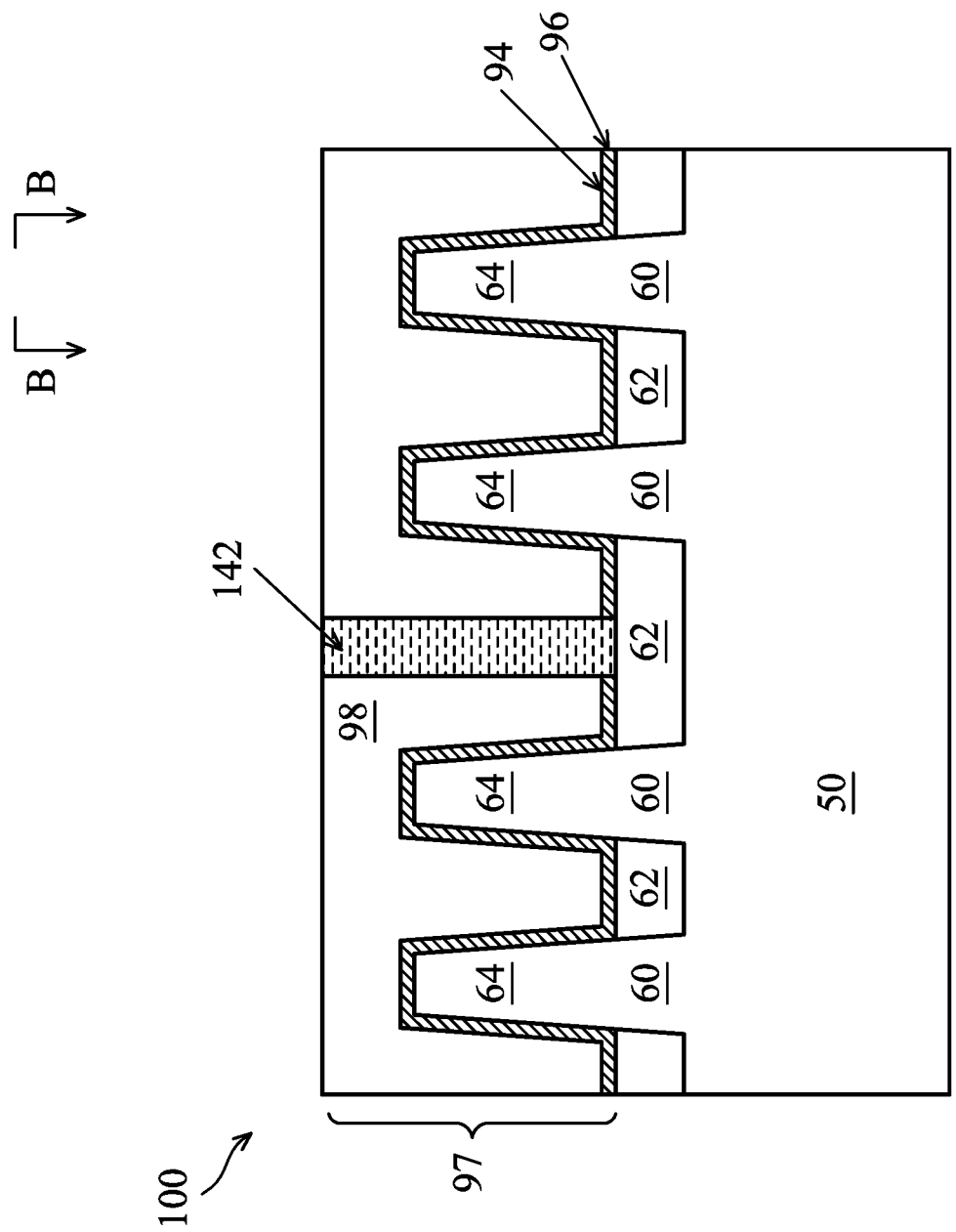

As illustrated in FIG. 39, a planarization process, such as a CMP process, is performed to remove the first hard mask layer 122, the second hard mask layer 124, and excess portions of the dielectric layer 142.

Embodiments may achieve advantages. By forming the replacement metal gate before forming the metal gate cut, the deposition of the metal gate may be improved. A metal gate cut can create narrow regions (for example, between a fin and a metal gate cut) that may be problematic for subsequent deposition to fill or cover, and thus forming the metal gate cut after the metal gate can reduce the number of these problematic regions. For example, using the techniques described herein, the deposition of the work-function layer, barrier layer, or gate fill may be more uniform and have greater filling efficiency, particularly in the region of a metal gate cut. In this manner, process defects may be reduced and device performance may be enhanced.

In an embodiment, a method includes etching a gate structure to form a trench extending into the gate structure, wherein sidewalls of the trench comprise a metal oxide material, applying a sidewall treatment process to the sidewalls of the trench, wherein the metal oxide material has been removed as a result of applying the sidewall treatment process and filling the trench with a first dielectric material to form a dielectric region, wherein the dielectric region is in contact with the sidewall of the gate structure.

In an embodiment, a method includes forming a first fin and a second fin over a substrate, wherein the first fin and the second fin are separated by an isolation region, forming a gate structure extending over the first fin and the second fin, etching the gate structure to form a trench extending into the gate structure and between the first fin and the second fin, applying a sidewall treatment process to sidewalls of the trench for converting a metal oxide material to a metal material and filling the trench with a first dielectric material to form a first dielectric region, wherein the first dielectric region is in contact with the sidewall of the gate structure.

In an embodiment, a method includes forming a first fin and a second fin over a substrate, wherein the first fin and the second fin are separated by an isolation region, forming a gate structure extending over the first fin and the second fin, etching the gate structure to form a trench extending into the gate structure, applying a first plasma enhanced atomic layer deposition (PEALD) process to sidewalls of the trench to remove a metal oxide material on the sidewalls of the trench and applying a second PEALD process to fill the trench with a dielectric material to form a dielectric region, wherein the first PEALD process and the second PEALD process are carried out in a same chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin over a substrate, wherein the first fin is adjacent to the second fin;
    forming a gate structure extending over the first fin and the second fin;
    depositing a first dielectric material surrounding the gate structure;
    etching the gate structure to form a trench extending into the gate structure, wherein sidewalls of the trench comprise a metal oxide material;
    applying a sidewall treatment process to the sidewalls of the trench, wherein the metal oxide material has been removed as a result of applying the sidewall treatment process; and
    filling the trench with a second dielectric material to form a dielectric region, wherein the dielectric region is in contact with the sidewall of the gate structure.

2. The method of claim 1, wherein:
    the second dielectric material is silicon nitride.

3. The method of claim 1, wherein etching the gate structure to form the trench extending into the gate structure comprises:
    depositing a hard mask layer over the gate structure;
    patterning the hard mask layer; and
    after the step of patterning the hard mask layer, etching the gate structure using the hard mask layer as an etching mask.

4. The method of claim 1, wherein:
    the sidewall treatment process is carried out in a plasma enhanced atomic layer deposition (PEALD) process.

5. The method of claim 1, wherein:
    the step of applying the sidewall treatment process to the sidewalls of the trench and the step of filling the trench with the second dielectric material are carried out in a same chamber.

6. The method of claim 1, wherein the step of applying the sidewall treatment process to the sidewalls of the trench and the step of filling the trench with the second dielectric material are performed simultaneously.

7. The method of claim 1, wherein:
    the sidewall treatment process is a $H_2$ plasma treatment process.

8. The method of claim 7, wherein:
    the sidewall treatment process is carried out a RF on step of a PEALD process.

9. A method comprising:
    forming a first fin and a second fin over a substrate, wherein the first fin and the second fin are separated by an isolation region;
    forming a gate structure extending over the first fin and the second fin;
    etching the gate structure to form a trench extending into the gate structure and between the first fin and the second fin;
    applying a sidewall treatment process to sidewalls of the trench for converting a metal oxide material to a metal material; and
    filling the trench with a first dielectric material to form a first dielectric region, wherein the first dielectric region is in contact with the sidewall of the gate structure.

10. The method of claim 9, wherein:
    the first dielectric material is silicon nitride.

11. The method of claim 9, further comprising:
    depositing a second dielectric material to form a second dielectric region over the first dielectric region, wherein at least one portion of the second dielectric region extends into the first dielectric region.

12. The method of claim 9, wherein:
    the sidewall treatment process a $H_2$ plasma treatment process carried out in a plasma enhanced atomic layer deposition (PEALD) process.

13. The method of claim 12, wherein:
    the PEALD process comprises a source feed step and a RF ON step applied after the source feed step, and wherein a precursor formed of diiodosilane is supplied in the source feed step, and the $H_2$ plasma treatment process is carried out in the RF ON step.

14. A method comprising:
    forming a first fin and a second fin over a substrate, wherein the first fin and the second fin are separated by an isolation region;
    forming a gate structure extending over the first fin and the second fin;
    etching the gate structure to form a trench extending into the gate structure;
    applying a first plasma enhanced atomic layer deposition (PEALD) process to sidewalls of the trench to remove a metal oxide material on the sidewalls of the trench; and
    applying a second PEALD process to fill the trench with a dielectric material to form a dielectric region, wherein the first PEALD process and the second PEALD process are carried out in a same chamber.

15. The method of claim 14, wherein:
    the gate structure is a metal gate structure comprising a gate dielectric layer, a work-function layer over the gate dielectric layer and a gate fill material layer over the work-function layer, and wherein the gate dielectric layer, the work-function layer and the gate fill material layer are in contact with the dielectric region.

16. The method of claim 14, wherein:
the first PEALD process is a pre-treat PEALD process and the second PEALD process is a bulk PEALD process applied after the pre-treat PEALD process.

17. The method of claim 16, wherein:
the pre-treat PEALD process comprises a source feed step, a first purge step, a nitridation step and a second purge step applied sequentially to the trench, and wherein a precursor comprising silicon is supplied in the source feed step and a nitrogen ($N_2$) gas is supplied in all four steps of the pre-treat PEALD process, and wherein the silicon of the precursor reacts with the nitrogen ($N_2$) to form silicon nitride in the nitridation step; and the bulk PEALD process comprises a source feed step, a first purge step, a nitridation step and a second purge step applied sequentially to the trench, and wherein a silicon nitride layer is formed in the nitridation step.

18. The method of claim 17, wherein:
a time duration of the source feed step of the pre-treat PEALD process is about 2 seconds; and
a time duration of the source feed step of the bulk PEALD process is about 0.3 seconds.

19. The method of claim 17, wherein:
a time duration of the nitridation step of the pre-treat PEALD process is about 30 seconds; and
a time duration of the nitridation step of the bulk PEALD process is about 1.6 seconds.

20. The method of claim 17, wherein:
the precursor is diiodosilane.

\* \* \* \* \*